(12) United States Patent
Gupta et al.

(10) Patent No.: US 12,322,471 B2
(45) Date of Patent: Jun. 3, 2025

(54) CONTENTION-FREE DUAL-VOLTAGE LOGIC CELL

(71) Applicant: NVIDIA Corp., Santa Clara, CA (US)

(72) Inventors: Lalit Gupta, Fremont, CA (US); Jason Golbus, Palo Alto, CA (US); Jesse San-Jey Wang, Santa Clara, CA (US)

(73) Assignee: NVIDIA Corp., Santa Clara, CA (US)

( * ) Notice: Subject to any disclaimer, the term of this patent is extended or adjusted under 35 U.S.C. 154(b) by 154 days.

(21) Appl. No.: 18/323,997

(22) Filed: May 25, 2023

(65) Prior Publication Data

US 2024/0395293 A1    Nov. 28, 2024

(51) Int. Cl.
  *G11C 11/41*    (2006.01)
  *G11C 7/10*    (2006.01)
  *G11C 7/18*    (2006.01)

(52) U.S. Cl.
  CPC .......... *G11C 7/1069* (2013.01); *G11C 7/1063* (2013.01); *G11C 7/1066* (2013.01); *G11C 7/18* (2013.01)

(58) Field of Classification Search
  CPC ............................................. G11C 11/41–419
  See application file for complete search history.

(56) References Cited

U.S. PATENT DOCUMENTS

2018/0342289 A1* 11/2018 Kulkarni ................ G11C 7/106

* cited by examiner

*Primary Examiner* — Alfredo Bermudez Lozada
(74) *Attorney, Agent, or Firm* — Carnelian Law, LLC

(57) ABSTRACT

Mechanisms to mitigate signal race conditions in circuits that utilize multiple voltage domains. The mechanisms are applicable in signal fanout scenarios where leakage becomes problematic to signal timing, such machine memory devices, e.g., volatile single port or multi-port memory devices such as SRAMs (volatile static random access memory) or other bit-storing cell arrangements that include memory cells and a hierarchical bitline structure including local bitlines for subsets of the memory banks and a global bitline spanning the subsets.

20 Claims, 20 Drawing Sheets

CONTENTION-FREE DUAL-VOLTAGE LOGIC CELL

BACKGROUND

A memory bank is a unit of data storage in electronics, which is hardware-dependent. In a computer, for example, the memory bank may be determined by the physical organization of the hardware memory. In a typical static random-access memory (static RAM or SRAM), a bank may include multiple rows and columns of storage units, and is usually spread out across circuits. An SRAM is a type of semiconductor memory that uses bi-stable latching circuitry (e.g., a flip-flop or a portion thereof) to store each bit. In a single read or write operation, generally only one bank is accessed. Often a memory may be referred to as a register file.

A common feature of most modern memories is the use of a hierarchical bitline arrangement in which, instead of a single bitline that runs the complete height of a column of memory cells and connects to each cell in the column, a multi-level structure is used. Effectively, a single bitline is broken up into multiple "local bitlines", each of which connects to the memory cells in a part of the column. A "global bitline" also runs the height of the column, and is connected to the local bitlines via switches. The memory read and write circuits connect to the global bitline, and not directly to the local bitline. During a memory access, only a local bitline in the relevant part of the column is connected (via its local-to-global switch) to the global bitline.

Often bit cell based register files are typically organized in multiple array banks. Each bank may be organized with multiple bit-cells on a local bitline. Wherein the bitline is local to the bank. Generally, a bitline conveys information when a memory access (e.g., read, write) occurs. Each bank may be connected to a dynamic global bitline that runs through or is included by each bank (hence, the global nature of the bit-line).

Generally, the global bitline is attached to two circuits. A keeper or pull-up device which serves the purpose of retaining the state of the global bitline when it is not actively driven. And a separate pre-charge device that pulls the global bitline "high" or up after the evaluation phase of the memory access completes. In some implementations, some or all of the local bitlines may be coupled to keeper circuits.

Often the demands placed on the global bitline cause issues with the register file. For example, the keeper device is required to work across a wide range of process, voltage and temperature (PVT) variations, and prevent the global bitline from leaking current and transitioning to "low" when it is not desired. In another example, a contention may exist between the keeper circuit (pulling the global bitline "high") and a bank's bitline pull-down device (pulling the global bitline "low"). Timing problems may also arise with the keeper circuit when the bitcells and the read port for the bitcells operate at different potentials. For example, when the bitcell operates at a low potential (e.g., 0.5V) and the read port operates at a higher potential (e.g., 1.35V), the evaluation phase of a bitcell 'read' operation may slow substantially compared to situations where the bitcell and read port both operate at a same or similar higher potentials.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
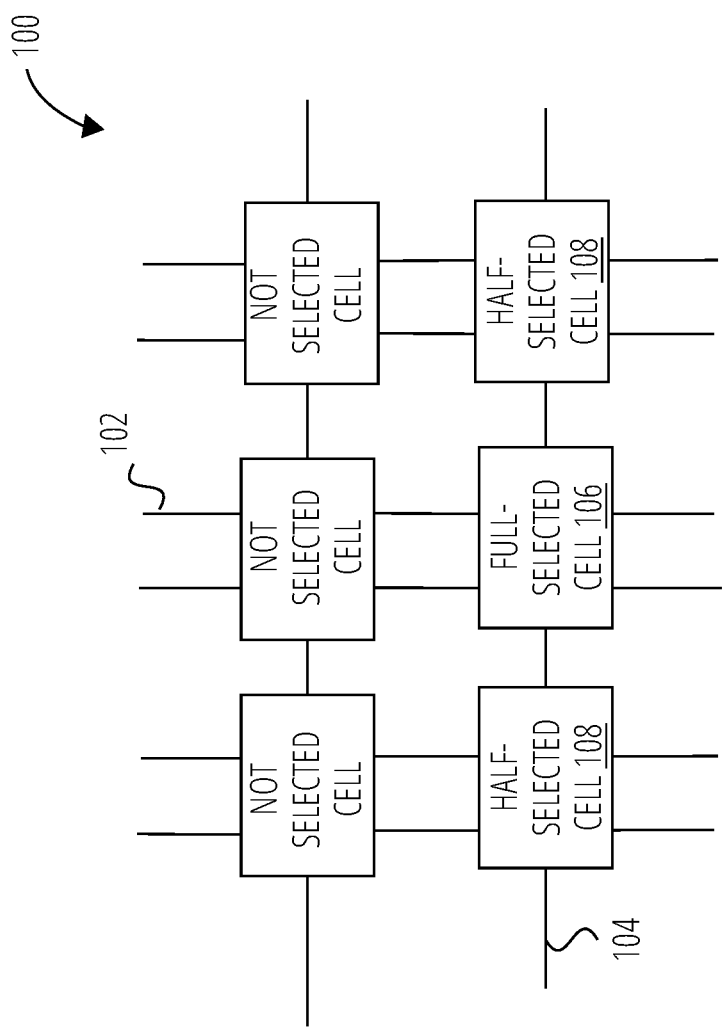
FIG. 1 depicts memory cells 100 in accordance with one embodiment.

Disclosed herein are mechanisms to mitigate signal race conditions in circuits that utilize multiple voltage domains. The described mechanisms are also applicable in signal fanout scenarios where leakage becomes problematic to signal timing. Examples are provided in the context of machine memory devices, e.g., volatile single port or multi-port memory devices such as SRAMs (volatile static random access memory), however the described mechanisms are more generally applicable.

The following description may be better understood with reference to the following terminology. Other terms should be accorded their conventional meaning in the art, or as indicated by context.

"Bit-storing cell" is another term for a memory cell, but also encompasses value-storing circuits such as latches and registers.

"Corresponding bit cell", in the context of an output transistor, refers to the bit-storing cell that the output transistor interfaces to the global bitline.

"Global bitline" refers to a bitline that spans groups of memory cells each with local bitlines.

"Global read evaluation signal" refers to a signal applied to multiple bit-storing cells simultaneously, one of which will actually be evaluated (using other signals) for its stored contents.

"Local bitlines" refers to bitlines that span only a sub-portion of the bit-storing cells that are spanned by a global bitline.

"Memory bank" refers to a group of bit-storing cells.

"Memory cell" refers to any circuit that stores a binary value.

"Memory controller" refers to logic that generates control signals for reading, writing, and managing memory cells.

"Output transistor" refers to a transistor that interfaces a memory cell to a global bitline.

"Pull-up transistor" refers to transistors between a given circuit node and a node at the voltage level of a power rail ("high binary voltage level").

"Read signal" refers to signals from a memory controller to cause the stored bit value in a bit-storing cell to be output to a bitline.

"Stored bit value" refers to a binary "1" or "0" value stored in a bit-storing cell.

"Stored value" is a short reference for stored bit value.

Disclosed herein are embodiments of circuits that include a plurality of memory banks and a global bitline distributed to output transistors of memory cells in each of the memory banks. The global read evaluation signal may be referred to as rcselb and the signal representing the stored value in a memory cell may be referred to as rnand_out.

The circuit embodiments may be implemented as a plurality of bit-storing cells each comprising an output transistor. A read signal is applied to the plurality of bit-storing cells each of which may store a value (e.g., a "1" or a "0"). A stored value is said to "satisfy" a value when it has that value or corresponds to common logical interpretation with the value. For example, a stored value may satisfy a high binary voltage level if both correspond to an interpretation of logical "1". Because bit-storing cells often store both a value and the complement of the value, the "stored value" should be understood to exclude the complement value, unless otherwise indicated.

In one specific embodiment, a static random access memory (SRAM) may include a plurality of memory banks each including memory cells that operate on dual supply voltages/domains, and a hierarchical bitline structure that includes local bitlines for the memory banks and a global bitline spanning the memory banks. A keeper circuit for the global bitline comprises bias circuitry on the clock line to automatically adapt timing of the keeper signal to variations in supply voltages for the memory cells.

Other technical features may be readily apparent to one skilled in the art from the following figures, descriptions, and claims.

FIG. 1 depicts memory cells 100 in a machine memory circuit in one embodiment. The memory cells 100 may utilize a six- or eight-transistor technology, for example. Vertical lines represent bitlines 102 and horizontal lines represent word lines 104. In this example the word line WL(n−1) is selected, meaning activated to perform a memory operation on one of the cells along the word line. The bitlines for full-selected cell 106 are also activated, and in conjunction with assertion of the word line WL(n−1) fully selects the full-selected cell 106 for a memory operation. The bitlines for the half-selected cells 108 are not activated, hence the cells are "half-selected".

Figure 2:
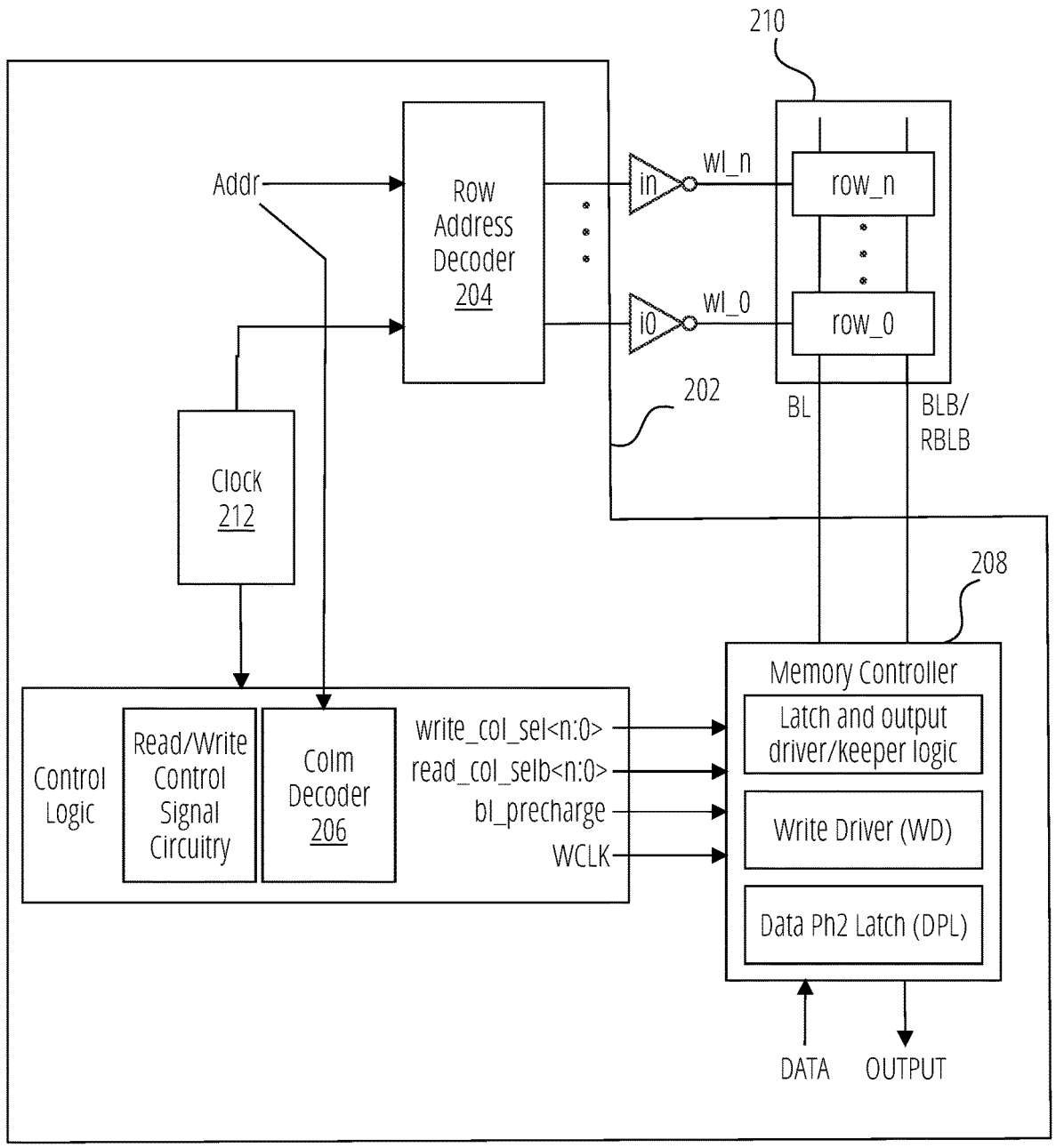
FIG. 2 depicts a memory controller in accordance with one embodiment.

FIG. 2 depicts a memory controller 202 in one embodiment. A row address decoder 204 translates a memory address into a row (word line) selection, and a column decoder 206 translates the address into column (bitline) selection(s). The bit-storing cells along the selected row and column are read by the memory controller 208, which includes latches for data read from the machine memory 210, keeper logic (described below), and logic for writing values into the bit-storing cells of the machine memory 210. These operations may be performed synchronously and thus coordinated by a clock 212.

Figure 3:
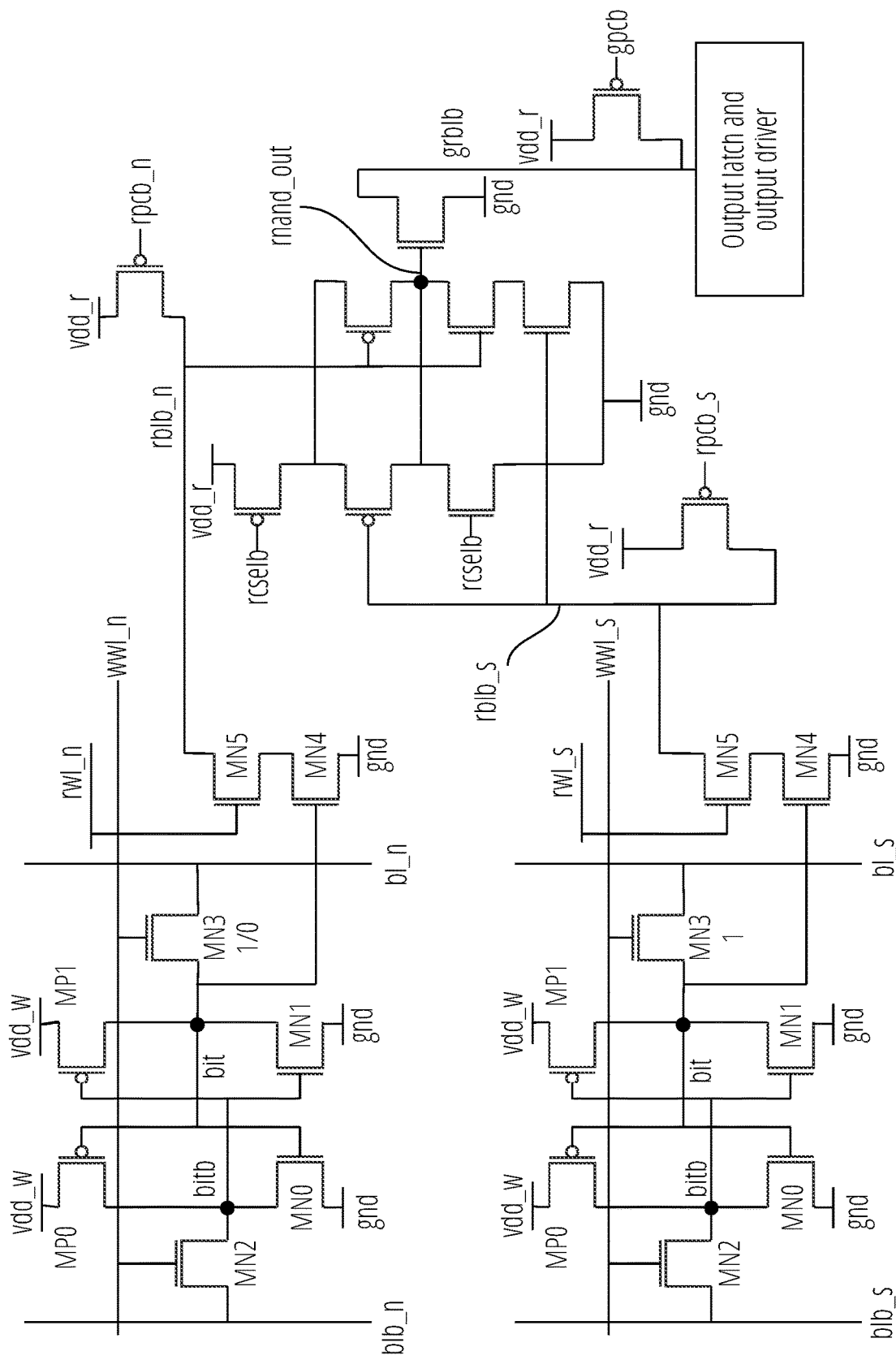
FIG. 3 depicts a memory cell in accordance with one embodiment.

FIG. 3 depicts an example of (two) bit-storing cells and associated logic to read the values stored in the cells out to a global bitline (grblb). A voltage domain crossing occurs in the bit-storing cell at transistor MN4, which has a source-drain potential determined by rwl_n and a gate potential determined by wwl_n. In other words, there is a voltage domain crossing at transistor MN4.

This can lead to slow performance when reading a stored bit value from the bit-storing cell in situations where the difference between the read word line voltage (rwl_n) and the write word line voltage (wwl_n) is substantial (e.g., more than 25% of either voltage). The problem is especially acute when rwl_n is substantially higher than wwl_n. This performance penalty may be amplified as more word lines are added to the bitline.

Figure 4:
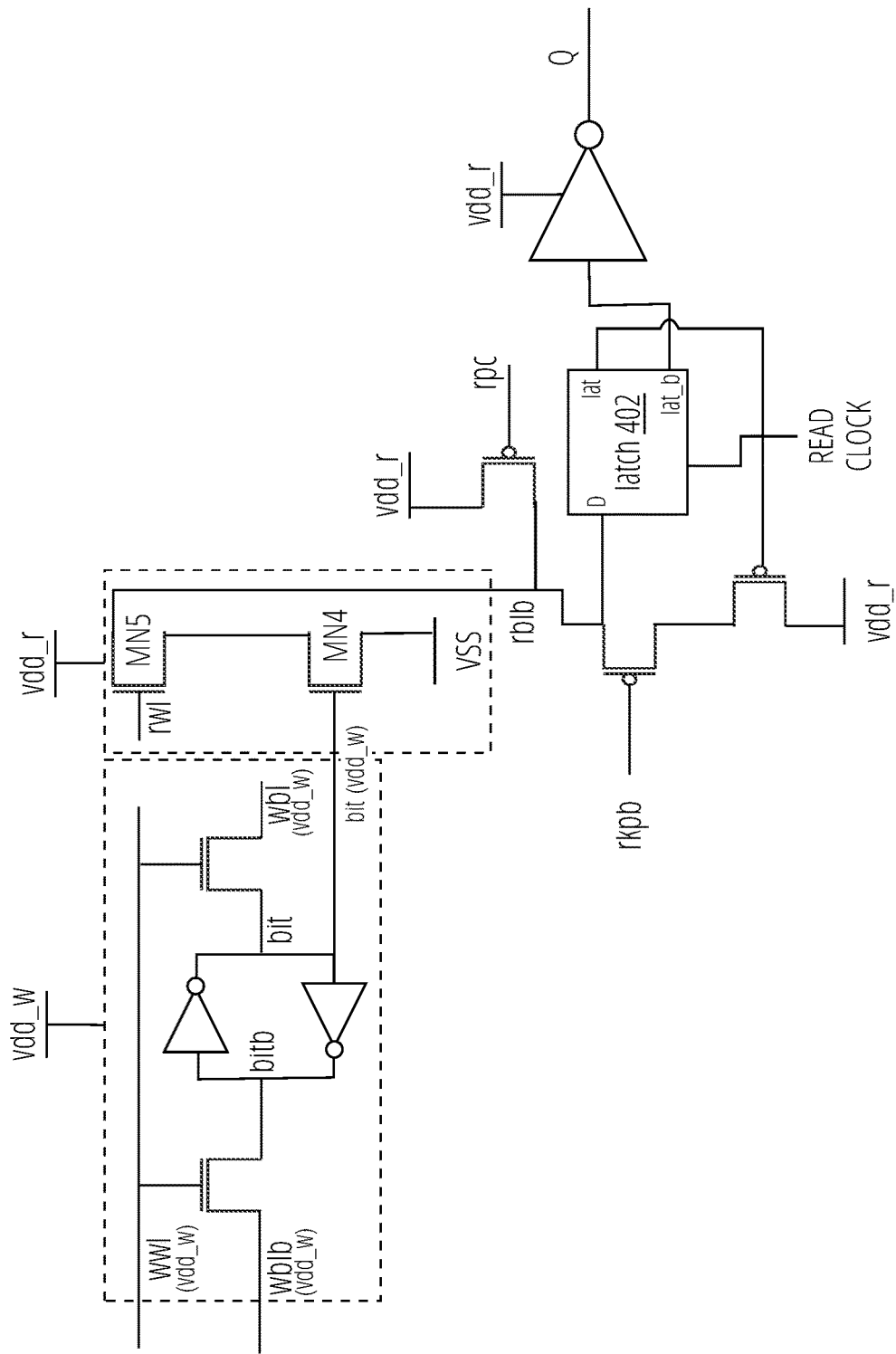
FIG. 4 illustrates an aspect of the subject matter in accordance with one embodiment.

FIG. 4 depicts a simplified diagram of the voltage domain crossing of one bit cell from the embodiment depicted in FIG. 3. Details of an embodiment of READ output latch 402 and output driver are also depicted. The embodiment depicted in FIG. 4 utilizes a keeper signal to mitigate leakage on the global bitline during a read evaluation 0 operation.

Figure 5:
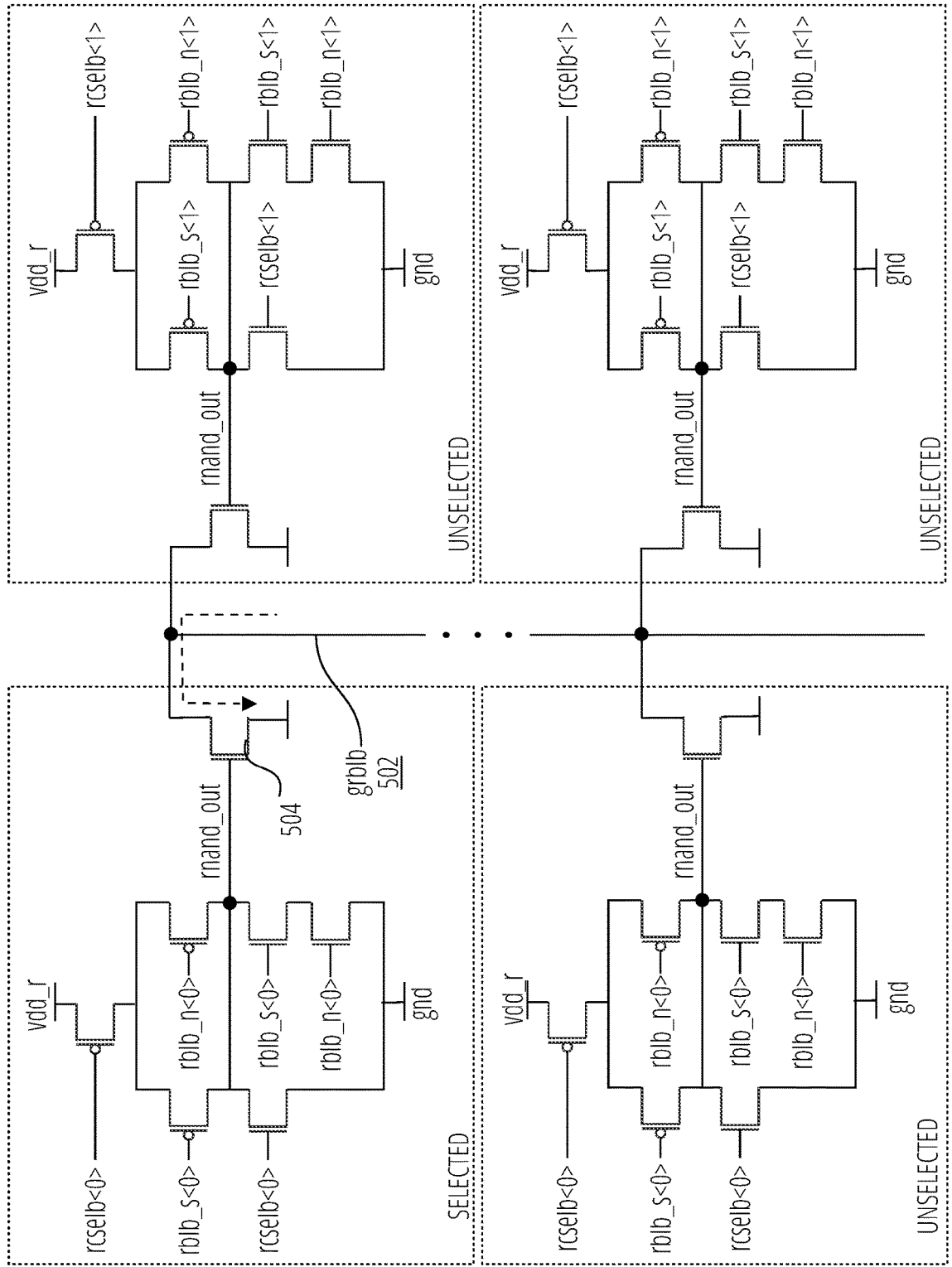
FIG. 5 depicts a conventional utilization of a global bitline (grblb) in a multi-banked memory.

FIG. 5 depicts logic to read the values stored in a number of bit-storing cells as organized along a global bitline 502 (grblb). Leakage occurs through the output transistors 504 of unselected bit-storing cells and this may cause discharge of the global bitline 502 from its precharged high binary voltage level. While not a problem during read evaluation 1 operations, this may lead to erroneous readings during read evaluation 0 operations.

Figure 6:
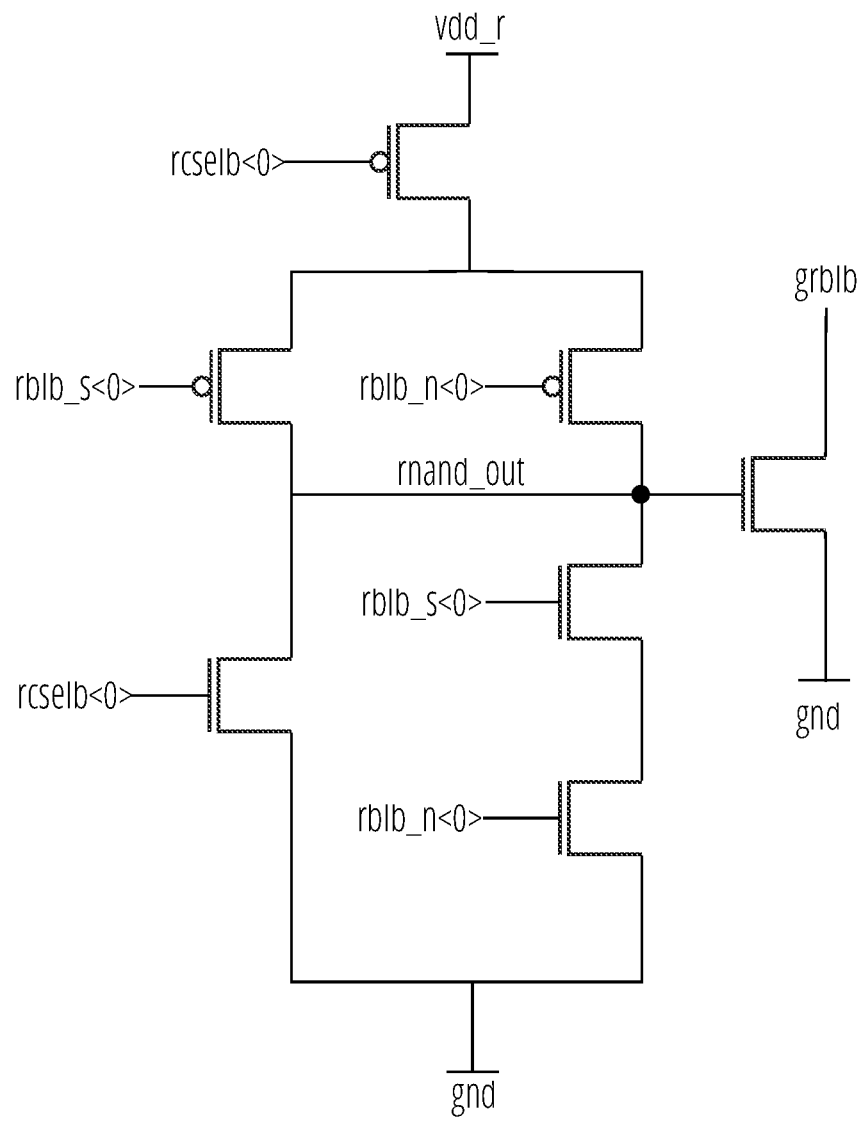
FIG. 6 depicts read evaluation circuitry according to one embodiment.

Referring to FIG. 6, during read evaluation 1, signal rblb_s is not discharged through the bitcell being evaluated, and rblb_n is discharged through the bitcell which sets signal rnand_out high and pulls grblb toward ground plane voltage VSS. During read evaluation 0, rblb_s does not discharge through the bitcell and retains its precharge voltage, rblb_n also retains its precharge voltage, and grblb stays, in theory, at or close to vdd_r (the READ domain supply voltage) because no discharge occurs through any local output transistor of the bit-storing cells on grblb (they all stay "off"). In the signal names, 'rblb' refers to a local bitline that usually spans the bit cells in a single memory bank vs the global bitline grblb, which spans multiple memory banks across the memory array)

However in practice, leakage occurs through the many "off" output transistors of the other bit-storing cells along grblb. Because read evaluation 0 takes a relatively long time to complete to the point of stable sensing, the leakage may pull the voltage on grblb below the point where the sensing circuit detects a low binary voltage level instead of high binary voltage level on grblb.

Figure 7:
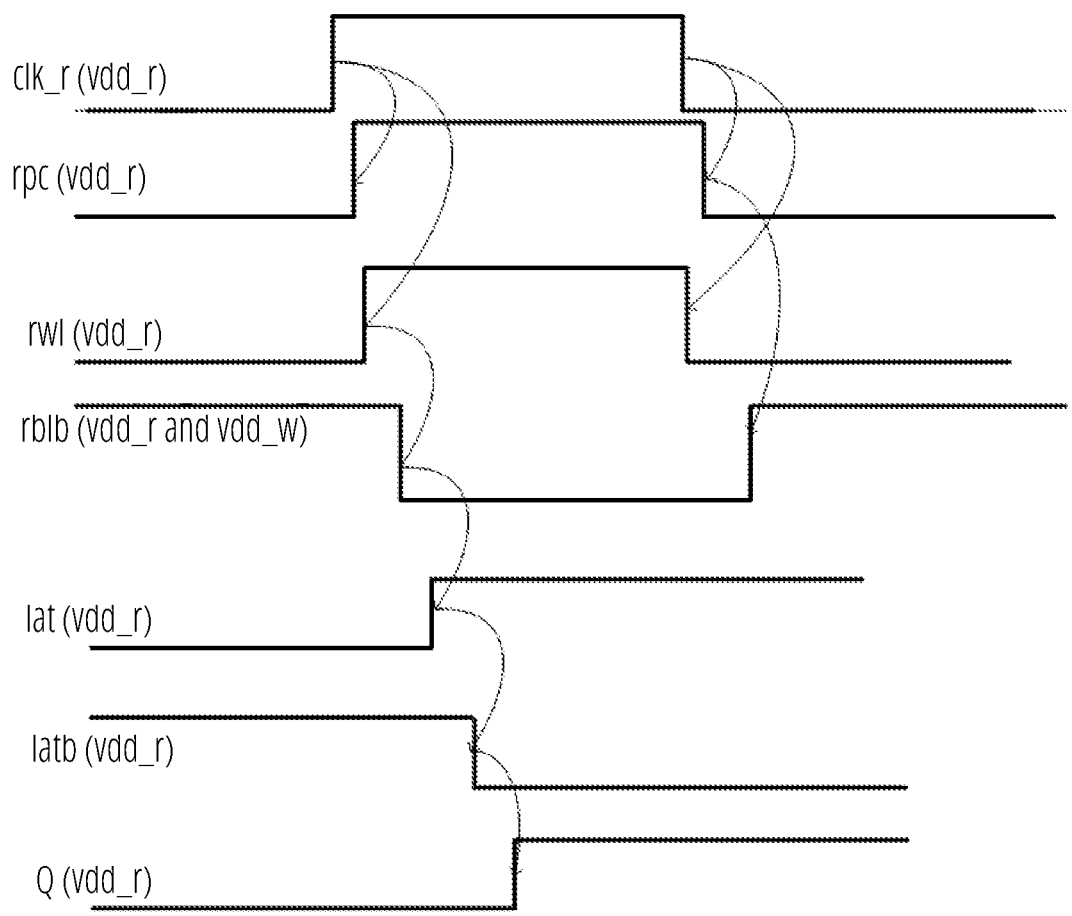
FIG. 7 depicts a timing diagram for read evaluation 1 in one embodiment.

Evaluation 1 refers to a process whereby a stored "1" causes the discharging of grblb, and evaluation 0 refers to a process whereby a stored "0" causes grblb to remain in a precharged state. FIG. 7 depicts read evaluation 1 signal timing in one embodiment. When the selected bit-storing cell stores a "1", rnand_out quickly pulls grblb to "0" and the stored "1" is sensed with adequate timing margin.

Figure 8:
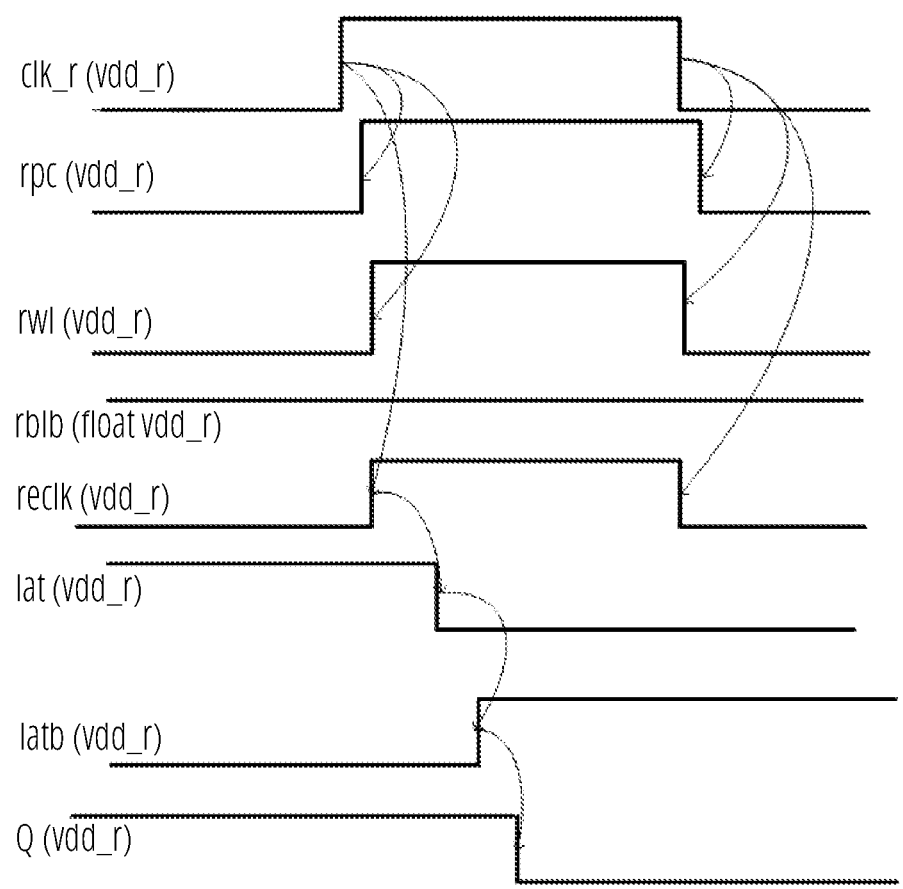
FIG. 8 depicts another timing diagram for read evaluation 0 in one embodiment.

FIG. 8 depicts read evaluation 0 signal timing in one embodiment. When the selected bit-storing cell stores a "0", rnand_out remains at VSS and grblb (ideally) remains at the precharged high binary voltage level (vdd_r) with adequate timing margin such that the "0" bit stored in the selected bit-storing cell is accurately sensed.

Figure 9:
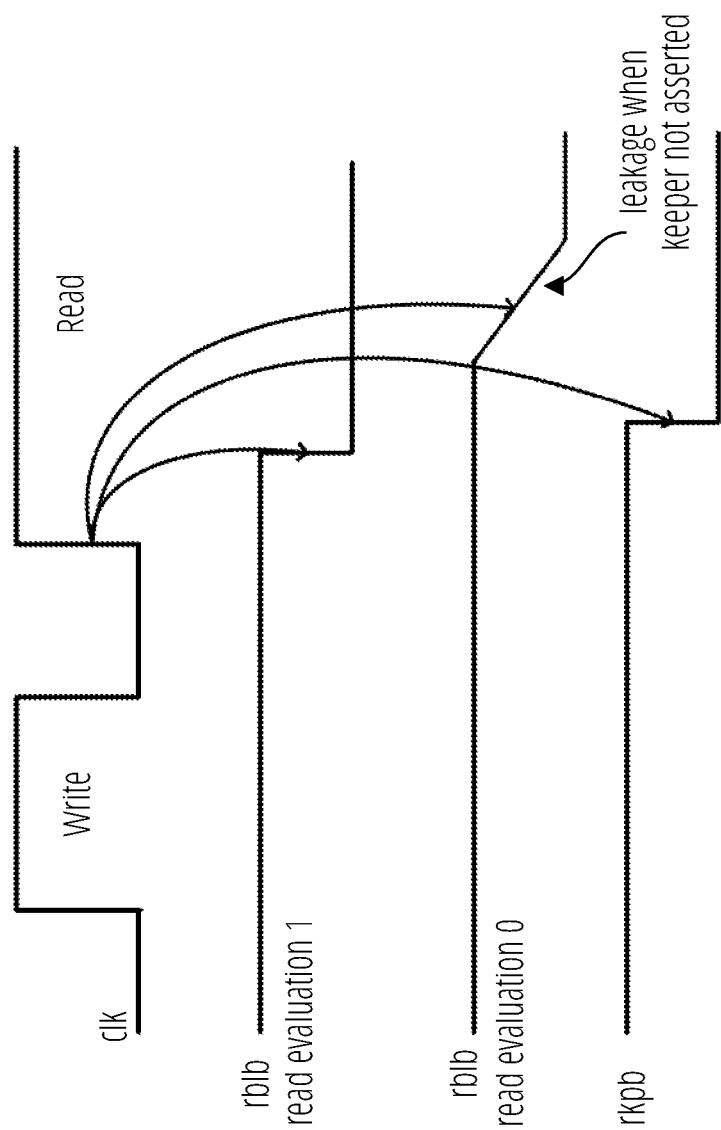
FIG. 9 depicts a timing diagram in accordance with one embodiment.

FIG. 9 depicts a timing diagram for read evaluation 1 and read evaluation 0 with respect to the grblb keeper signal. For read evaluation 1, the keeper signal is triggered soon after the discharge of grblb, so as not to interfere with the discharge and create an erroneous reading. During read evaluation 0 grblb should ideally remain charged to vdd_r but due to leakage it may discharge to the point that an erroneous "1" value is detected in the evaluated cell. If the keeper signal is not triggered, grblb will start to discharge due to leakage (as depicted), which may, depending on latencies in the system, lead to erroneous readings. Hence the timing of the grblb keeper signal is critical. Because leakage and other factors may vary over large circuit areas due to process, timing, and voltage variations, among other things, the timing window of the keeper signal becomes highly constrained.

Figure 10:
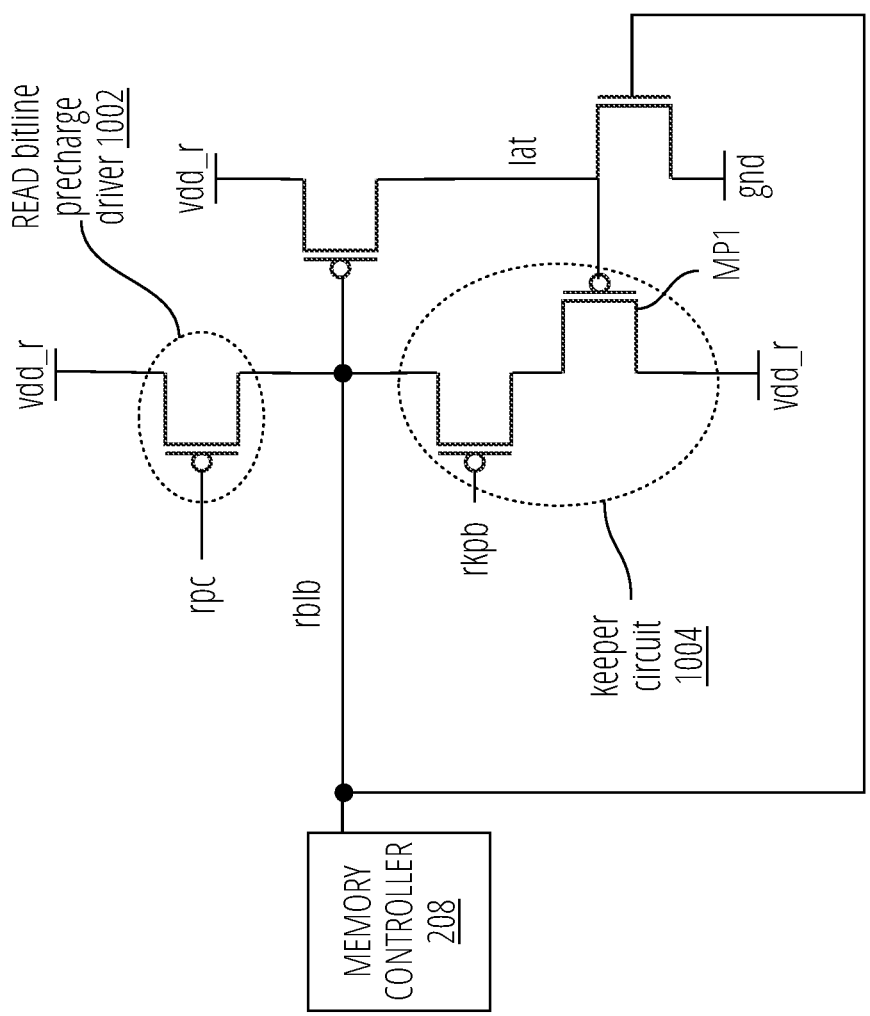
FIG. 10 depicts a grblb precharge and keeper circuit in one embodiment.

FIG. 10 depicts a READ bitline precharge driver 1002 and keeper circuit 1004 in one embodiment.

In a precharge phase, signal grblb_pc is activated (e.g., active "low") to pull the global bitline grblb "high", e.g., to a high binary voltage level vdd_r. Signal grblb_pc is then deactivated and the read evaluation phase begins. During this phase, a full-selected cell is evaluated for whether it stores a "0" bit or a "1" bit. These are referred to herein as "read evaluation 0" and "read evaluation 1". The keeper circuit comes into play to prevent decay of the high binary voltage level on grblb during read evaluation 0. The transistor MP1 stays on unless/until the voltage on grblb falls sufficiently (due to leakage through other "off" output transistors on grblb) to turn it off, at which point, if rkpb goes low before MP1 transistor turn off, grblb is pulled back up to the high binary voltage level and kept there sufficiently long that the sense circuity of the system detects the "0" value stored in the full-selected cell. This is referred to as "sustaining the high binary voltage level" on grblb.

If rkpb is dropped too early during read evaluation 1, it will disturb the bit being read onto grblb which fights the discharge of grblb. If rkpb is dropped too late, grblb may discharge too much during read evaluation 0. The precise tolerance requirements for the timing of signal rkpb is problematic in large systems where process, voltage, and temperature variations, and/or signal propagation delays, become substantial.

Figure 11A:
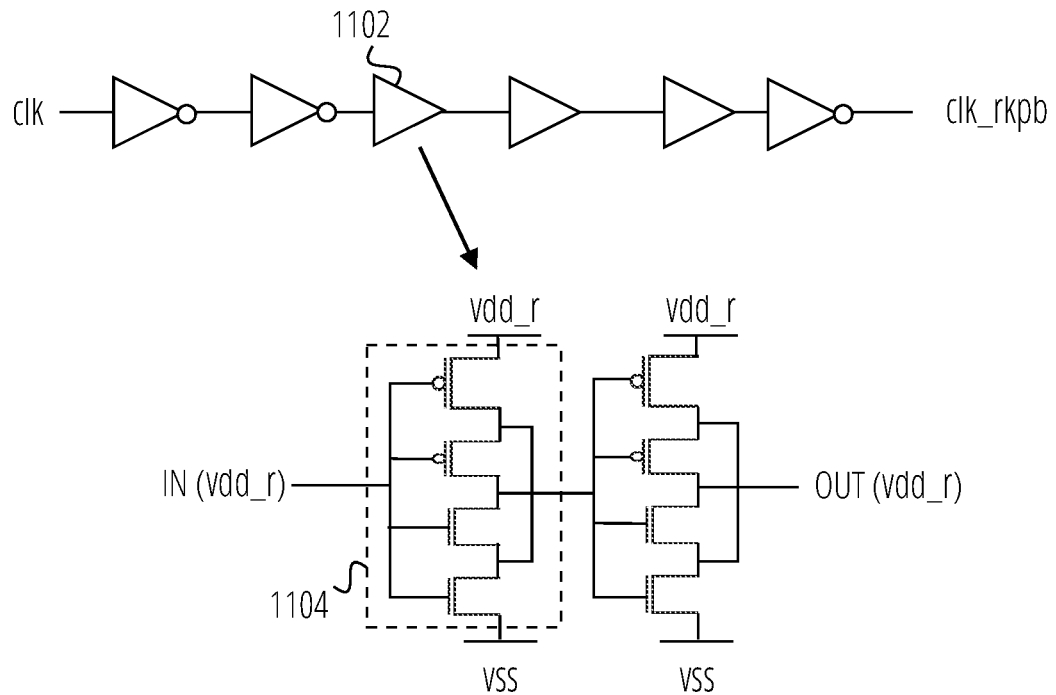
FIG. 11A depicts a conventional clock signal delay line.

FIG. 11A depicts a conventional clock line. It some conventional designs this type of clock line may be utilized to clock a keeper circuit latch or flop. The clock line comprises a number of delay elements 1102 selected and configured to cause assertion of the keeper signal to fall within in the critical timing window as explained in conjunction with FIG. 9. Each delay element 1102 operates exclusively in the read voltage domain for the bit-storing cells. The channels of the PFET/NFET transistors of the delay element internal stages 1104 are supplied by the read voltage domain power rail (vdd_r). The propagating keeper circuit clock that propagates through the delay element internal stages 1104 via the gates of the transistors is ranged between VSS (reference rail) and vdd_r. As process, temperature, or other factors lead to wider variations between the read and write voltage domains of the bit-storing cells, the timing of the keeper signal may drift outside the critical window.

Figure 11B:
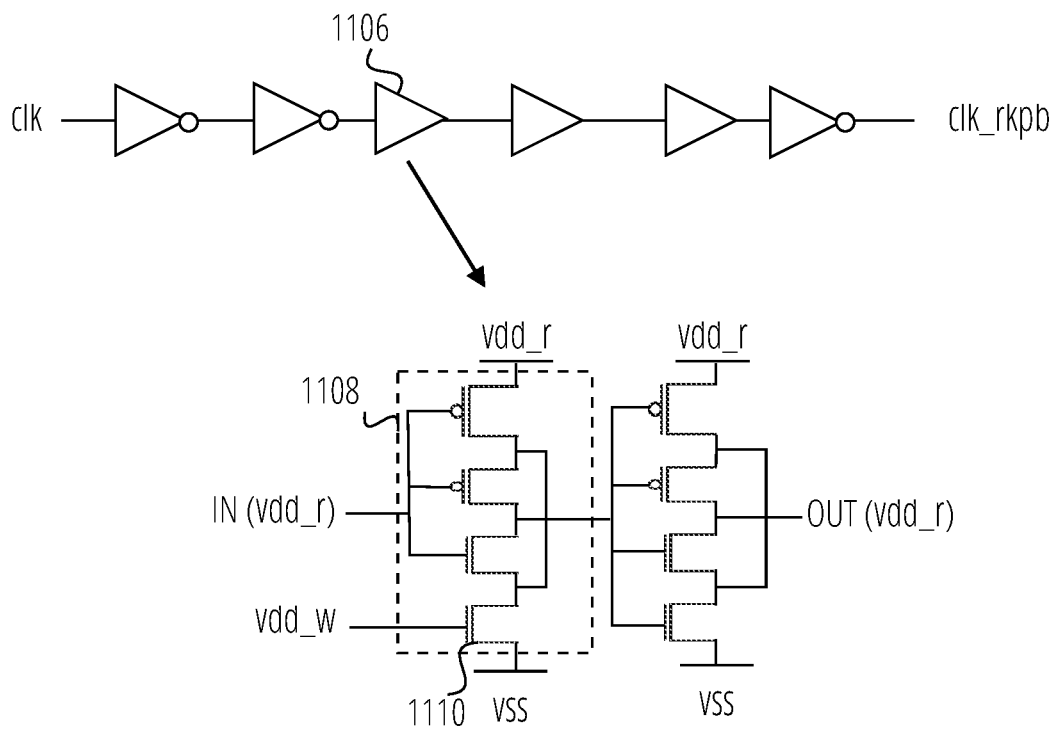
FIG. 11B depicts a modified clock signal delay line in accordance with one embodiment.

FIG. 11B depicts an embodiment of a modified clock line and delay element 1106. The clock line may be configured to drive a latch or flop for an output signal (e.g., a keeper signal). One or more of the delay element internal stages 1108 of one or more of the delay elements 1106 comprises an application of both of the read and write voltage domains for the bit-storing cells.

The channels of the stacked PFET/NFET transistors of the delay element internal stages 1108 are supplied by the read voltage domain power rail (vdd_r), whereas the gate of NMOS pull-down transistor 1110 in the stack is biased by either the write domain voltage (vdd_w) itself, or a voltage that tracks (is derived from or otherwise follows the behavior of) vdd_w. The signal vdd_w acts as a modulation/bias on the propagation delay of the clk signal through the delay elements 1106. All signal switching through the delay elements 1106 is carried out in the range of the vdd_r voltage domain.

The example depicts the vdd_w bias implemented in an input stage of a delay element 1106 comprising two delay stages. Generally, the delay element 1106 may comprise more than two delay stages, and the bias may be implemented in any one or more of these stages.

As the gap between vdd_r and vdd_w varies, the propagation delay of the keeper circuit clock is modulated accordingly through the delay element internal stages 1108 that utilize the bias. In this manner the timing of the keeper signal may be maintained in the critical window depicted in FIG. 9 across variations in the (vdd_r-vdd_w) gap. The timing of the keeper circuit signal tracks variations in the performance of bit-storing cells and their read ports (where voltage domain crossing occur) during the reading of bits, thus mitigating race conditions without contention between the voltage domains.

Thus in one aspect, a circuit that includes a plurality of memory banks and a global bitline distributed to memory cells may utilize supply voltages from both of a write domain supply and a read domain supply in the memory cells (e.g., a write supply domain for the bit-storing cell and a read supply domain for the read port). The memory cells may be configured to output a stored value to the global bitline (via the read port) in response to a global read evaluation signal. Logic such as a keeper circuit (implemented in the periphery of the memory banks, e.g., in a memory controller circuit) maintains the global read evaluation signal in a timing window by adaptive adjustment of a delay for activating a keeper signal for the global read evaluation signal, the adaptive adjustment based on variations to at least one of the supply voltages.

The circuit may operate the global read evaluation signal and the keeper signal in the read domain. The adaptive adjustment to the delay may be based on variations in a gap between the read and write supply voltages, and may be implemented by one or more delay elements in a clock line for the logic to maintain the global read evaluation signal in a timing window, for example by forming at least one of the delay elements that implement the delay adjustment with a PN transistor stack receiving channel voltage from the read domain and a pull-down transistor with a gate biased from the write domain.

Other technical features may be readily apparent to one skilled in the art from the following figures, descriptions, and claims. In one specific embodiment, the memory cells are six-transistor memory cells (e.g., FIG. 3).

Figure 12A:
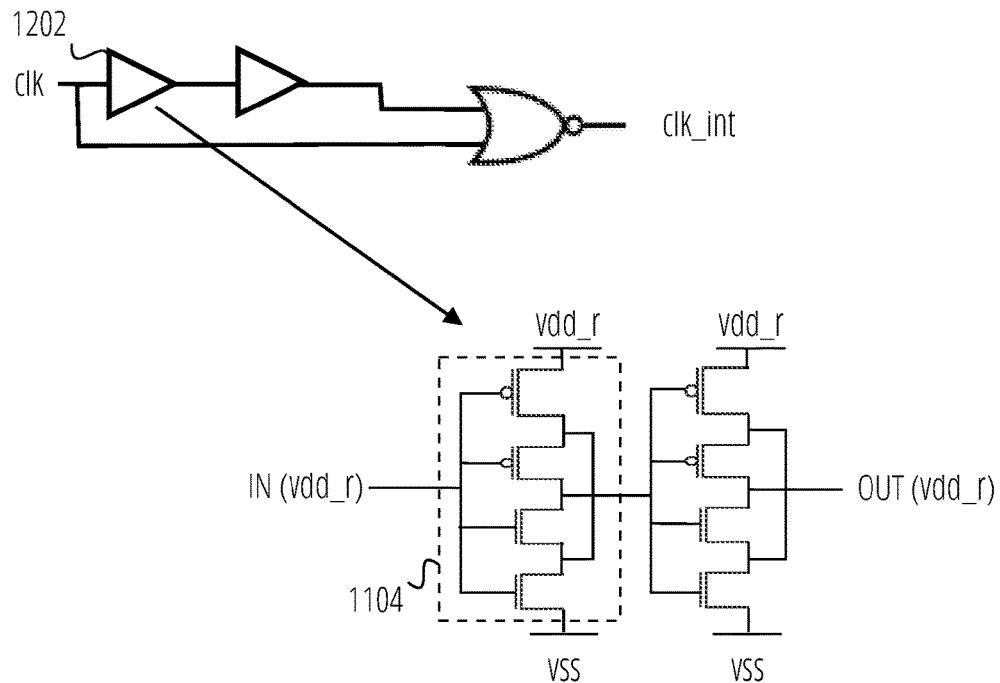
FIG. 12A depicts a conventional clock signal delay line.

FIG. 12A depicts another example of a conventional clock line, e.g. for clocking a latch or flop. The clock line comprises a number of delay elements 1202 utilized in conventional designs. Each of the delay elements 1202 operates exclusively in the read voltage domain vdd_r for the bit-storing cells. The channels of the PFET/NFET transistors of the delay element internal stages 1104 are supplied by the read voltage domain power rail (vdd_r). The clock signal that propagates through the delay element internal stages 1104 via the gates of the transistors is ranged between VSS (reference rail) and vdd_r. With this conventional solution, as process, temperature, or other factors lead to wider variations between the read and write voltage domains of the bit-storing cells, the timing of the clocked signal may drift outside the critical window.

Figure 12B:
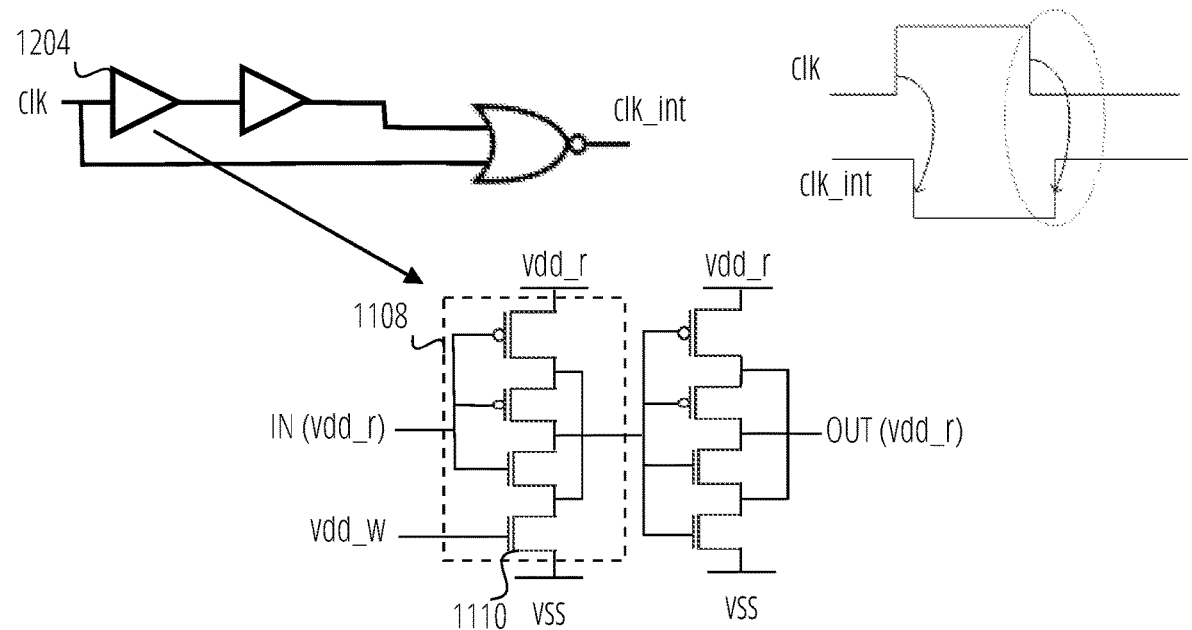
FIG. 12B depicts a modified clock signal delay line in accordance with one embodiment.

FIG. 12B depicts another embodiment of a modified clock line and delay elements 1202. The clock line may be configured to drive a latch or flop for a signal (e.g., a READ word line signal rwl during READ evaluation 1 operations). One or more of the delay element internal stages 1108 of one or more of the delay elements 1202 comprises an application of both of the read and write voltage domains for the bit-storing cells.

As the spread between vdd_w and vdd_r widens, the discharge rate of the pre-charged local bitline for the bit cell being read from slows down. To adjust to this condition, the width of the read word line pulse, rwl, may be widened based on vdd_w utilizing the logic depicted in FIG. 12B.

The example depicts the vdd_w bias implemented in an input delay element internal stage 1108 comprising two delay stages. Generally, the delay elements 1202 may comprise more than two delay stages, and the bias may be implemented in any one or more of these stages.

As the gap between vdd_r and vdd_w varies, the width of the clock pulses are modulated accordingly through the delay element internal stage 1104 that utilize the bias. In this manner the timing and duration of the READ signals (particularly during READ evaluation 1) may be maintained to compensate for variations in the (vdd_r-vdd_w) gap. The pulse width tracks variations in the performance of bit-storing cells and their read ports (where voltage domain crossing occur) during the reading of bits, thus mitigating race conditions without contention between the voltage domains.

The memory circuits and keeper mechanisms disclosed herein may be utilized in computing devices comprising one or more graphic processing unit (GPU) and/or general purpose data processor (e.g., a 'central processing unit or CPU). Exemplary architectures will now be described that may be configured with such circuits, for example for use with reading data from volatile memory devices (e.g., SRAMs).

The following description may use certain acronyms and abbreviations as follows:

"DPC" refers to a "data processing cluster";
"GPC" refers to a "general processing cluster";
"I/O" refers to a "input/output";
"L1 cache" refers to "level one cache";
"L2 cache" refers to "level two cache";
"LSU" refers to a "load/store unit";
"MMU" refers to a "memory management unit";
"MPC" refers to an "M-pipe controller";
"PPU" refers to a "parallel processing unit";
"PROP" refers to a "pre-raster operations unit";
"ROP" refers to a "raster operations";
"SFU" refers to a "special function unit";
"SM" refers to a "streaming multiprocessor";
"Viewport SCC" refers to "viewport scale, cull, and clip";
"WDX" refers to a "work distribution crossbar"; and
"XBar" refers to a "crossbar".

Parallel Processing Unit

Figure 13:
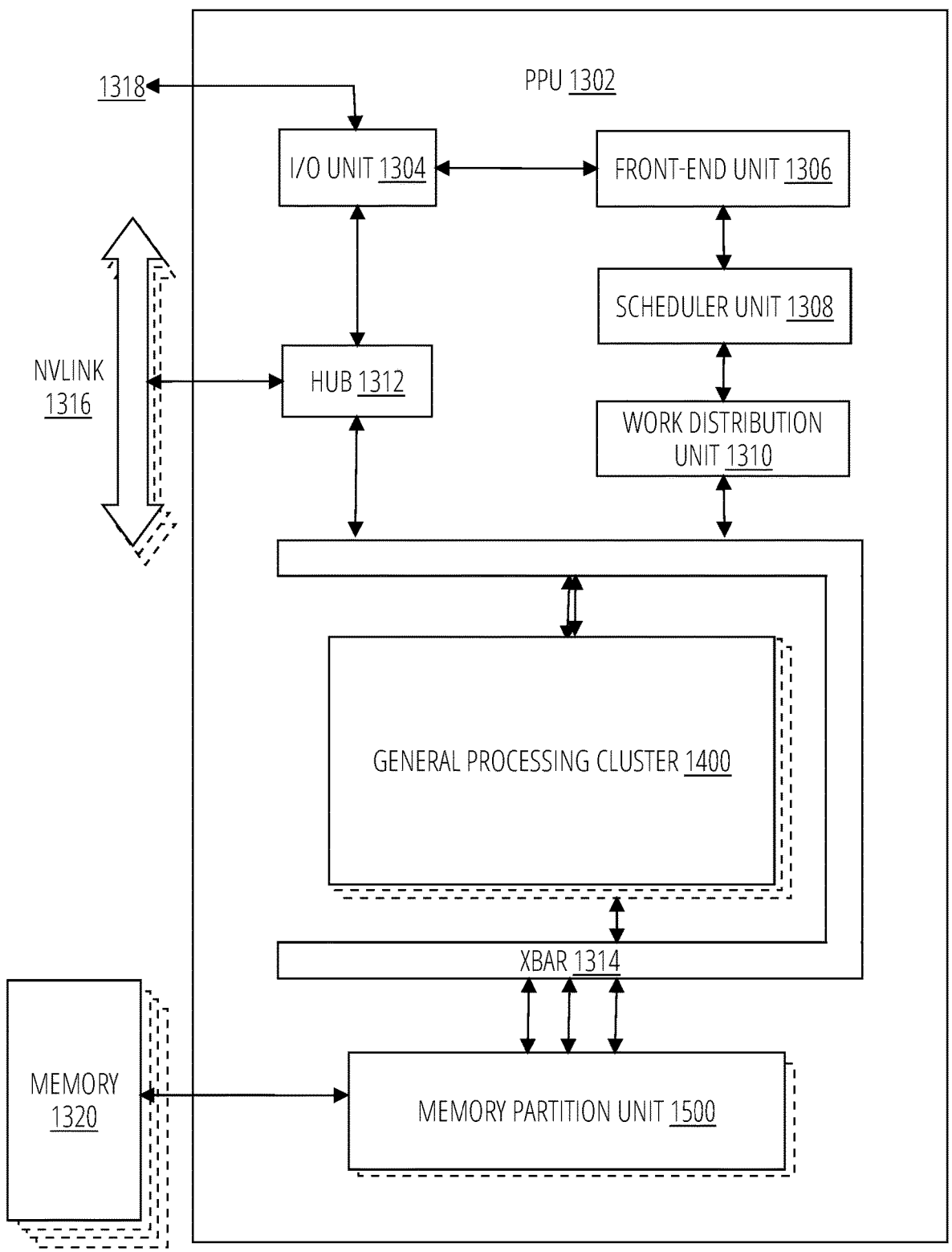
FIG. 13 depicts a parallel processing unit 1302 in accordance with one embodiment.

FIG. 13 depicts a parallel processing unit 1302, in accordance with an embodiment. In an embodiment, the parallel processing unit 1302 is a multi-threaded processor that is implemented on one or more integrated circuit devices. The parallel processing unit 1302 is a latency hiding architecture designed to process many threads in parallel. A thread (e.g., a thread of execution) is an instantiation of a set of instructions configured to be executed by the parallel processing unit 1302. In an embodiment, the parallel processing unit 1302 is a graphics processing unit (GPU) configured to implement a graphics rendering pipeline for processing three-dimensional (3D) graphics data in order to generate two-dimensional (2D) image data for display on a display device such as a liquid crystal display (LCD) device. In other embodiments, the parallel processing unit 1302 may be utilized for performing general-purpose computations. While one exemplary parallel processor is provided herein for illustrative purposes, it should be strongly noted that such processor is set forth for illustrative purposes only, and that any processor may be employed to supplement and/or substitute for the same.

One or more parallel processing unit 1302 modules may be configured to accelerate thousands of High Performance Computing (HPC), data center, and machine learning applications. The parallel processing unit 1302 may be configured to accelerate numerous deep learning systems and applications including autonomous vehicle platforms, deep learning, high-accuracy speech, image, and text recognition systems, intelligent video analytics, molecular simulations, drug discovery, disease diagnosis, weather forecasting, big data analytics, astronomy, molecular dynamics simulation, financial modeling, robotics, factory automation, real-time language translation, online search optimizations, and personalized user recommendations, and the like.

As shown in FIG. 13, the parallel processing unit 1302 includes an I/O unit 1304, a front-end unit 1306, a scheduler unit 1308, a work distribution unit 1310, a hub 1312, a crossbar 1314, one or more general processing cluster 1400 modules, and one or more memory partition unit 1500 modules. The parallel processing unit 1302 may be connected to a host processor or other parallel processing unit 1302 modules via one or more high-speed NVLink 1316 interconnects. The parallel processing unit 1302 may be connected to a host processor or other peripheral devices via an interconnect 1318. The parallel processing unit 1302 may also be connected to a local memory comprising a number of memory 1320 devices. In an embodiment, the local memory may comprise a number of dynamic random access memory (DRAM) devices. The DRAM devices may be configured as a high-bandwidth memory (HBM) subsystem, with multiple DRAM dies stacked within each device. The memory 1320 may comprise logic to configure the parallel processing unit 1302 to carry out aspects of the techniques disclosed herein.

The NVLink 1316 interconnect enables systems to scale and include one or more parallel processing unit 1302 modules combined with one or more CPUs, supports cache coherence between the parallel processing unit 1302 modules and CPUs, and CPU mastering. Data and/or commands may be transmitted by the NVLink 1316 through the hub 1312 to/from other units of the parallel processing unit 1302 such as one or more copy engines, a video encoder, a video decoder, a power management unit, etc. (not explicitly shown). The NVLink 1316 is described in more detail in conjunction with FIG. 17.

The I/O unit 1304 is configured to transmit and receive communications (e.g., commands, data, etc.) from a host processor (not shown) over the interconnect 1318. The I/O unit 1304 may communicate with the host processor directly via the interconnect 1318 or through one or more intermediate devices such as a memory bridge. In an embodiment, the I/O unit 1304 may communicate with one or more other processors, such as one or more parallel processing unit 1302 modules via the interconnect 1318. In an embodiment, the I/O unit 1304 implements a Peripheral Component Interconnect Express (PCIe) interface for communications over a PCIe bus and the interconnect 1318 is a PCIe bus. In alternative embodiments, the I/O unit 1304 may implement other types of well-known interfaces for communicating with external devices.

The I/O unit 1304 decodes packets received via the interconnect 1318. In an embodiment, the packets represent commands configured to cause the parallel processing unit 1302 to perform various operations. The I/O unit 1304 transmits the decoded commands to various other units of the parallel processing unit 1302 as the commands may specify. For example, some commands may be transmitted to the front-end unit 1306. Other commands may be transmitted to the hub 1312 or other units of the parallel processing unit 1302 such as one or more copy engines, a video encoder, a video decoder, a power management unit, etc. (not explicitly shown). In other words, the I/O unit 1304 is configured to route communications between and among the various logical units of the parallel processing unit 1302.

In an embodiment, a program executed by the host processor encodes a command stream in a buffer that provides workloads to the parallel processing unit 1302 for processing. A workload may comprise several instructions and data to be processed by those instructions. The buffer is a region in a memory that is accessible (e.g., read/write) by both the host processor and the parallel processing unit 1302. For example, the I/O unit 1304 may be configured to access the buffer in a system memory connected to the interconnect 1318 via memory requests transmitted over the interconnect 1318. In an embodiment, the host processor writes the command stream to the buffer and then transmits a pointer to the start of the command stream to the parallel processing unit 1302. The front-end unit 1306 receives pointers to one or more command streams. The front-end unit 1306 manages the one or more streams, reading commands from the streams and forwarding commands to the various units of the parallel processing unit 1302.

The front-end unit 1306 is coupled to a scheduler unit 1308 that configures the various general processing cluster 1400 modules to process tasks defined by the one or more streams. The scheduler unit 1308 is configured to track state information related to the various tasks managed by the scheduler unit 1308. The state may indicate which general processing cluster 1400 a task is assigned to, whether the task is active or inactive, a priority level associated with the task, and so forth. The scheduler unit 1308 manages the execution of a plurality of tasks on the one or more general processing cluster 1400 modules.

The scheduler unit 1308 is coupled to a work distribution unit 1310 that is configured to dispatch tasks for execution on the general processing cluster 1400 modules. The work distribution unit 1310 may track a number of scheduled tasks received from the scheduler unit 1308. In an embodiment, the work distribution unit 1310 manages a pending task pool and an active task pool for each of the general processing cluster 1400 modules. The pending task pool may comprise a number of slots (e.g., 32 slots) that contain tasks assigned to be processed by a particular general processing cluster 1400. The active task pool may comprise a number of slots (e.g., 4 slots) for tasks that are actively being processed by the general processing cluster 1400 modules. As a general processing cluster 1400 finishes the execution of a task, that task is evicted from the active task pool for the general processing cluster 1400 and one of the other tasks from the pending task pool is selected and scheduled for execution on the general processing cluster 1400. If an active task has been idle on the general processing cluster 1400, such as while waiting for a data dependency to be resolved, then the active task may be evicted from the general processing cluster 1400 and returned to the pending task pool while another task in the pending task pool is selected and scheduled for execution on the general processing cluster 1400.

The work distribution unit 1310 communicates with the one or more general processing cluster 1400 modules via crossbar 1314. The crossbar 1314 is an interconnect network that couples many of the units of the parallel processing unit 1302 to other units of the parallel processing unit 1302. For example, the crossbar 1314 may be configured to couple the work distribution unit 1310 to a particular general processing cluster 1400. Although not shown explicitly, one or more other units of the parallel processing unit 1302 may also be connected to the crossbar 1314 via the hub 1312.

The tasks are managed by the scheduler unit 1308 and dispatched to a general processing cluster 1400 by the work distribution unit 1310. The general processing cluster 1400 is configured to process the task and generate results. The results may be consumed by other tasks within the general processing cluster 1400, routed to a different general processing cluster 1400 via the crossbar 1314, or stored in the memory 1320. The results can be written to the memory 1320 via the memory partition unit 1500 modules, which implement a memory interface for reading and writing data to/from the memory 1320. The results can be transmitted to another parallel processing unit 1302 or CPU via the NVLink 1316. In an embodiment, the parallel processing unit 1302 includes a number U of memory partition unit 1500 modules that is equal to the number of separate and distinct memory 1320 devices coupled to the parallel processing unit 1302. A memory partition unit 1500 will be described in more detail below in conjunction with FIG. 15.

In an embodiment, a host processor executes a driver kernel that implements an application programming interface (API) that enables one or more applications executing on the host processor to schedule operations for execution on the parallel processing unit 1302. In an embodiment, multiple compute applications are simultaneously executed by the parallel processing unit 1302 and the parallel processing unit 1302 provides isolation, quality of service (QoS), and independent address spaces for the multiple compute applications. An application may generate instructions (e.g., API calls) that cause the driver kernel to generate one or more tasks for execution by the parallel processing unit 1302. The driver kernel outputs tasks to one or more streams being processed by the parallel processing unit 1302. Each task may comprise one or more groups of related threads, referred to herein as a warp. In an embodiment, a warp comprises 32 related threads that may be executed in parallel. Cooperating threads may refer to a plurality of threads including instructions to perform the task and that may exchange data through shared memory. Threads and cooperating threads are described in more detail in conjunction with FIG. 16.

Figure 14:
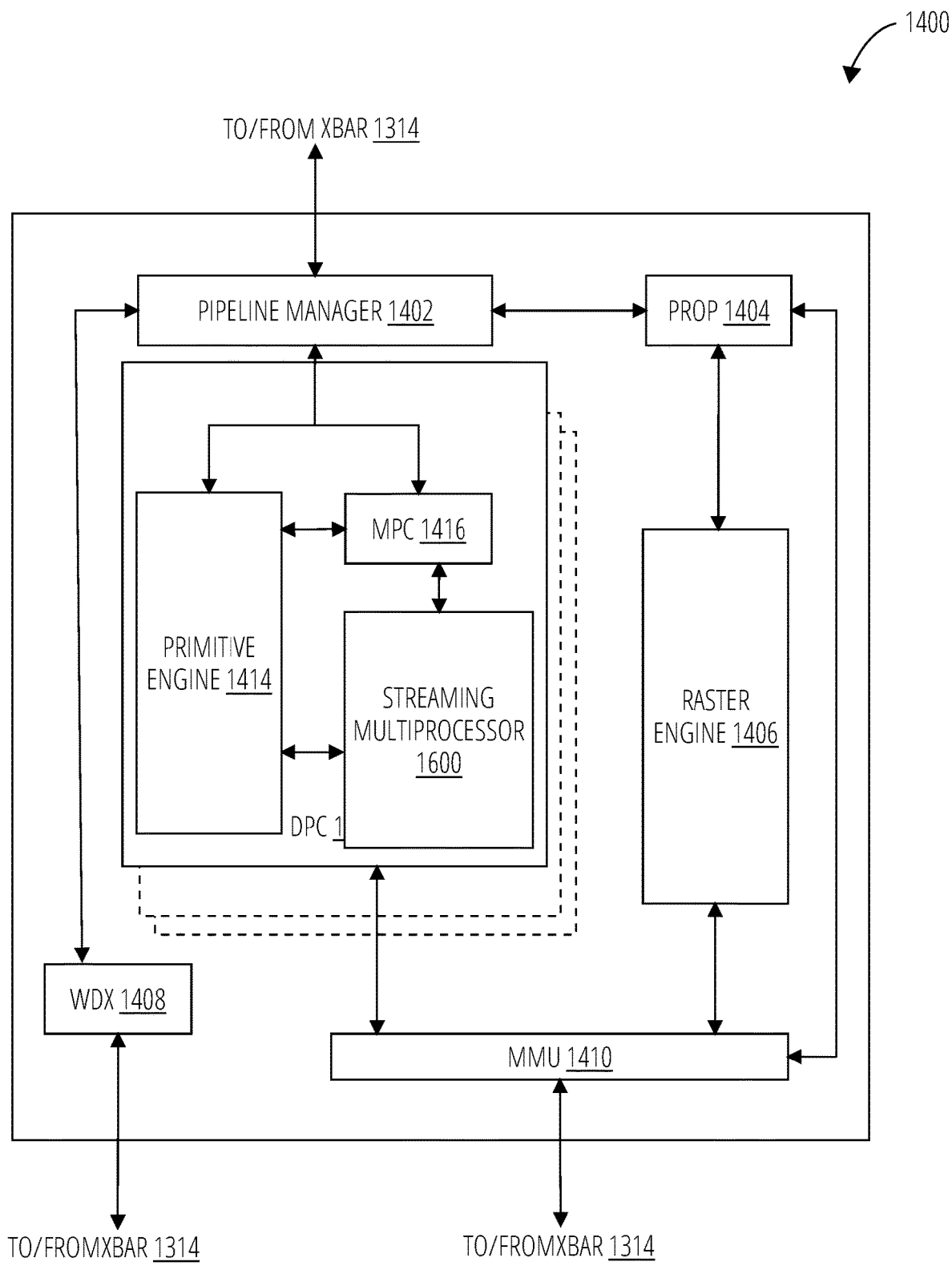
FIG. 14 depicts a general processing cluster 1400 in accordance with one embodiment.

FIG. 14 depicts a general processing cluster 1400 of the parallel processing unit 1302 of FIG. 13, in accordance with an embodiment. As shown in FIG. 14, each general processing cluster 1400 includes a number of hardware units for processing tasks. In an embodiment, each general processing cluster 1400 includes a pipeline manager 1402, a pre-raster operations unit 1404, a raster engine 1406, a work distribution crossbar 1408, a memory management unit 1410, and one or more data processing cluster 1412. It will be appreciated that the general processing cluster 1400 of FIG. 14 may include other hardware units in lieu of or in addition to the units shown in FIG. 14.

In an embodiment, the operation of the general processing cluster 1400 is controlled by the pipeline manager 1402. The pipeline manager 1402 manages the configuration of the one or more data processing cluster 1412 modules for processing tasks allocated to the general processing cluster 1400. In an embodiment, the pipeline manager 1402 may configure at least one of the one or more data processing cluster 1412 modules to implement at least a portion of a graphics rendering pipeline. For example, a data processing cluster 1412 may be configured to execute a vertex shader program on the programmable streaming multiprocessor 1600. The pipeline manager 1402 may also be configured to route packets received from the work distribution unit 1310 to the appropriate logical units within the general processing cluster 1400. For example, some packets may be routed to fixed function hardware units in the pre-raster operations unit 1404 and/or raster engine 1406 while other packets may be routed to the data processing cluster 1412 modules for processing by the primitive engine 1414 or the streaming multiprocessor 1600. In an embodiment, the pipeline manager 1402 may configure at least one of the one or more data processing cluster 1412 modules to implement a neural network model and/or a computing pipeline.

Figure 15:
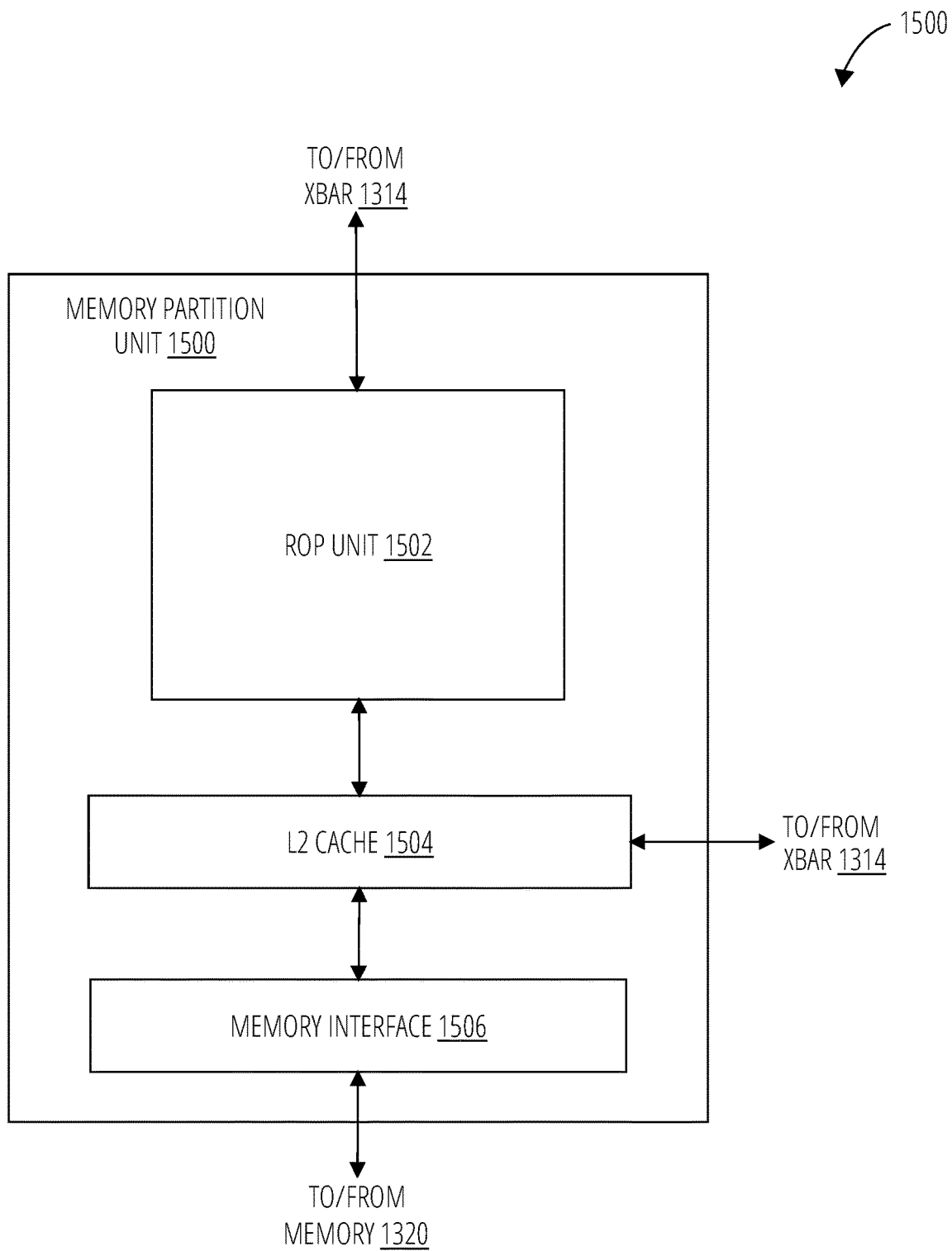
FIG. 15 depicts a memory partition unit 1500 in accordance with one embodiment.

The pre-raster operations unit 1404 is configured to route data generated by the raster engine 1406 and the data processing cluster 1412 modules to a Raster Operations (ROP) unit, described in more detail in conjunction with FIG. 15. The pre-raster operations unit 1404 may also be configured to perform optimizations for color blending, organize pixel data, perform address translations, and the like.

The raster engine 1406 includes a number of fixed function hardware units configured to perform various raster operations. In an embodiment, the raster engine 1406 includes a setup engine, a coarse raster engine, a culling engine, a clipping engine, a fine raster engine, and a tile coalescing engine. The setup engine receives transformed vertices and generates plane equations associated with the geometric primitive defined by the vertices. The plane equations are transmitted to the coarse raster engine to generate coverage information (e.g., an x, y coverage mask for a tile) for the primitive. The output of the coarse raster engine is transmitted to the culling engine where fragments associated with the primitive that fail a z-test are culled, and transmitted to a clipping engine where fragments lying outside a viewing frustum are clipped. Those fragments that survive clipping and culling may be passed to the fine raster engine to generate attributes for the pixel fragments based on the plane equations generated by the setup engine. The output of the raster engine 1406 comprises fragments to be processed, for example, by a fragment shader implemented within a data processing cluster 1412.

Each data processing cluster 1412 included in the general processing cluster 1400 includes an M-pipe controller 1416, a primitive engine 1414, and one or more streaming multiprocessor 1600 modules. The M-pipe controller 1416 controls the operation of the data processing cluster 1412, routing packets received from the pipeline manager 1402 to the appropriate units in the data processing cluster 1412. For example, packets associated with a vertex may be routed to the primitive engine 1414, which is configured to fetch vertex attributes associated with the vertex from the memory 1320. In contrast, packets associated with a shader program may be transmitted to the streaming multiprocessor 1600.

The streaming multiprocessor 1600 comprises a programmable streaming processor that is configured to process tasks represented by a number of threads. Each streaming multiprocessor 1600 is multi-threaded and configured to execute a plurality of threads (e.g., 32 threads) from a particular group of threads concurrently. In an embodiment, the streaming multiprocessor 1600 implements a Single-Instruction, Multiple-Data (SIMD) architecture where each thread in a group of threads (e.g., a warp) is configured to process a different set of data based on the same set of instructions. All threads in the group of threads execute the same instructions. In another embodiment, the streaming multiprocessor 1600 implements a Single-Instruction, Multiple Thread (SIMT) architecture where each thread in a group of threads is configured to process a different set of data based on the same set of instructions, but where individual threads in the group of threads are allowed to diverge during execution. In an embodiment, a program counter, call stack, and execution state is maintained for each warp, enabling concurrency between warps and serial execution within warps when threads within the warp diverge. In another embodiment, a program counter, call stack, and execution state is maintained for each individual thread, enabling equal concurrency between all threads, within and between warps. When execution state is maintained for each individual thread, threads executing the same instructions may be converged and executed in parallel for maximum efficiency. The streaming multiprocessor 1600 will be described in more detail below in conjunction with FIG. 16.

The memory management unit 1410 provides an interface between the general processing cluster 1400 and the memory partition unit 1500. The memory management unit 1410 may provide translation of virtual addresses into physical addresses, memory protection, and arbitration of memory requests. In an embodiment, the memory management unit 1410 provides one or more translation lookaside buffers (TLBs) for performing translation of virtual addresses into physical addresses in the memory 1320.

FIG. 15 depicts a memory partition unit 1500 of the parallel processing unit 1302 of FIG. 13, in accordance with an embodiment. As shown in FIG. 15, the memory partition unit 1500 includes a raster operations unit 1502, a level two cache 1504, and a memory interface 1506. The memory interface 1506 is coupled to the memory 1320. Memory interface 1506 may implement 32, 64, 128, 1024-bit data buses, or the like, for high-speed data transfer. In an embodiment, the parallel processing unit 1302 incorporates U memory interface 1506 modules, one memory interface 1506 per pair of memory partition unit 1500 modules, where each pair of memory partition unit 1500 modules is connected to a corresponding memory 1320 device. For example, parallel processing unit 1302 may be connected to up to Y memory 1320 devices, such as high bandwidth memory stacks or graphics double-data-rate, version 5, synchronous dynamic random access memory, or other types of persistent storage.

In an embodiment, the memory interface 1506 implements an HBM2 memory interface and Y equals half U. In an embodiment, the HBM2 memory stacks are located on the same physical package as the parallel processing unit 1302, providing substantial power and area savings compared with conventional GDDR5 SDRAM systems. In an embodiment, each HBM2 stack includes four memory dies and Y equals 4, with HBM2 stack including two 128-bit channels per die for a total of 8 channels and a data bus width of 1024 bits.

In an embodiment, the memory 1320 supports Single-Error Correcting Double-Error Detecting (SECDED) Error Correction Code (ECC) to protect data. ECC provides higher reliability for compute applications that are sensitive to data corruption. Reliability is especially important in large-scale cluster computing environments where parallel processing unit 1302 modules process very large datasets and/or run applications for extended periods.

In an embodiment, the parallel processing unit 1302 implements a multi-level memory hierarchy. In an embodiment, the memory partition unit 1500 supports a unified memory to provide a single unified virtual address space for CPU and parallel processing unit 1302 memory, enabling data sharing between virtual memory systems. In an embodiment the frequency of accesses by a parallel processing unit 1302 to memory located on other processors is traced to ensure that memory pages are moved to the physical memory of the parallel processing unit 1302 that is accessing the pages more frequently. In an embodiment, the NVLink 1316 supports address translation services allowing the parallel processing unit 1302 to directly access a CPU's page tables and providing full access to CPU memory by the parallel processing unit 1302.

In an embodiment, copy engines transfer data between multiple parallel processing unit 1302 modules or between parallel processing unit 1302 modules and CPUs. The copy engines can generate page faults for addresses that are not mapped into the page tables. The memory partition unit 1500 can then service the page faults, mapping the addresses into the page table, after which the copy engine can perform the transfer. In a conventional system, memory is pinned (e.g., non-pageable) for multiple copy engine operations between multiple processors, substantially reducing the available memory. With hardware page faulting, addresses can be passed to the copy engines without worrying if the memory pages are resident, and the copy process is transparent.

Data from the memory 1320 or other system memory may be fetched by the memory partition unit 1500 and stored in the level two cache 1504, which is located on-chip and is shared between the various general processing cluster 1400 modules. As shown, each memory partition unit 1500 includes a portion of the level two cache 1504 associated with a corresponding memory 1320 device. Lower level caches may then be implemented in various units within the general processing cluster 1400 modules. For example, each of the streaming multiprocessor 1600 modules may implement an L1 cache. The L1 cache is private memory that is dedicated to a particular streaming multiprocessor 1600. Data from the level two cache 1504 may be fetched and stored in each of the L1 caches for processing in the functional units of the streaming multiprocessor 1600 modules. The level two cache 1504 is coupled to the memory interface 1506 and the crossbar 1314.

The raster operations unit 1502 performs graphics raster operations related to pixel color, such as color compression, pixel blending, and the like. The raster operations unit 1502 also implements depth testing in conjunction with the raster engine 1406, receiving a depth for a sample location associated with a pixel fragment from the culling engine of the raster engine 1406. The depth is tested against a corresponding depth in a depth buffer for a sample location associated with the fragment. If the fragment passes the depth test for the sample location, then the raster operations unit 1502 updates the depth buffer and transmits a result of the depth test to the raster engine 1406. It will be appreciated that the number of partition memory partition unit 1500 modules may be different than the number of general processing cluster 1400 modules and, therefore, each raster operations unit 1502 may be coupled to each of the general processing cluster 1400 modules. The raster operations unit 1502 tracks packets received from the different general processing cluster 1400 modules and determines which general processing cluster 1400 that a result generated by the raster operations unit 1502 is routed to through the crossbar 1314. Although the raster operations unit 1502 is included within the memory partition unit 1500 in FIG. 15, in other embodiment, the raster operations unit 1502 may be outside of the memory partition unit 1500. For example, the raster operations unit 1502 may reside in the general processing cluster 1400 or another unit.

Figure 16:
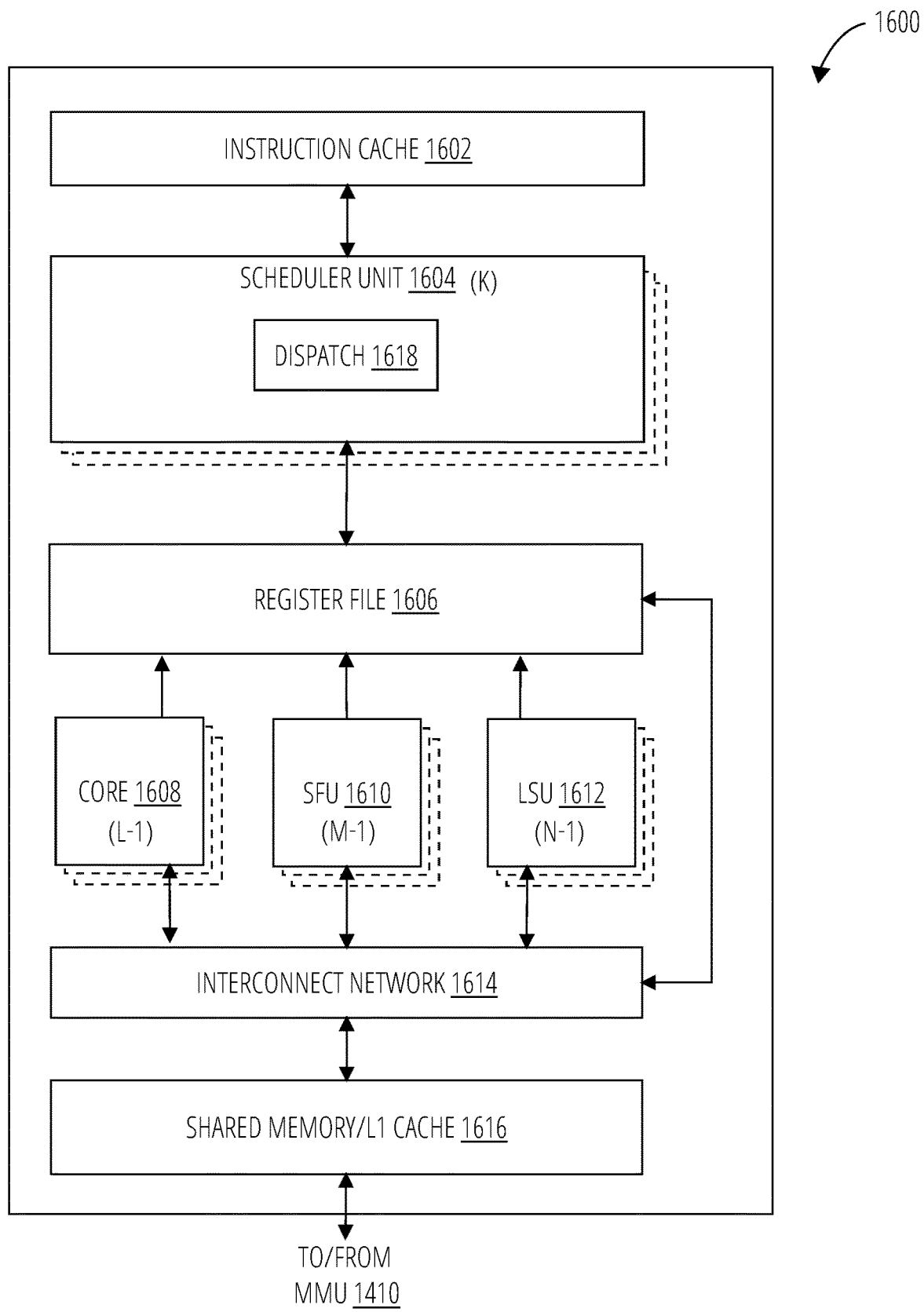
FIG. 16 depicts a streaming multiprocessor 1600 in accordance with one embodiment.

FIG. 16 illustrates the streaming multiprocessor 1600 of FIG. 14, in accordance with an embodiment. As shown in FIG. 16, the streaming multiprocessor 1600 includes an instruction cache 1602, one or more scheduler unit 1604 modules (e.g., such as scheduler unit 1308), a register file 1606, one or more processing core 1608 modules, one or more special function unit 1610 modules, one or more load/store unit 1612 modules, an interconnect network 1614, and a shared memory/L1 cache 1616.

As described above, the work distribution unit 1310 dispatches tasks for execution on the general processing cluster 1400 modules of the parallel processing unit 1302. The tasks are allocated to a particular data processing cluster 1412 within a general processing cluster 1400 and, if the task is associated with a shader program, the task may be allocated to a streaming multiprocessor 1600. The scheduler unit 1308 receives the tasks from the work distribution unit 1310 and manages instruction scheduling for one or more thread blocks assigned to the streaming multiprocessor 1600. The scheduler unit 1604 schedules thread blocks for execution as warps of parallel threads, where each thread block is allocated at least one warp. In an embodiment, each warp executes 32 threads. The scheduler unit 1604 may manage a plurality of different thread blocks, allocating the warps to the different thread blocks and then dispatching instructions from the plurality of different cooperative groups to the various functional units (e.g., core 1608 modules, special function unit 1610 modules, and load/store unit 1612 modules) during each clock cycle.

Cooperative Groups is a programming model for organizing groups of communicating threads that allows developers to express the granularity at which threads are communicating, enabling the expression of richer, more efficient parallel decompositions. Cooperative launch APIs support synchronization amongst thread blocks for the execution of parallel algorithms. Conventional programming models provide a single, simple construct for synchronizing cooperating threads: a barrier across all threads of a thread block (e.g., the syncthreads( ) function). However, programmers would often like to define groups of threads at smaller than thread block granularities and synchronize within the defined groups to enable greater performance, design flexibility, and software reuse in the form of collective group-wide function interfaces.

Cooperative Groups enables programmers to define groups of threads explicitly at sub-block (e.g., as small as a single thread) and multi-block granularities, and to perform collective operations such as synchronization on the threads in a cooperative group. The programming model supports clean composition across software boundaries, so that libraries and utility functions can synchronize safely within their local context without having to make assumptions about convergence. Cooperative Groups primitives enable new patterns of cooperative parallelism, including producer-consumer parallelism, opportunistic parallelism, and global synchronization across an entire grid of thread blocks.

A dispatch 1618 unit is configured within the scheduler unit 1604 to transmit instructions to one or more of the functional units. In one embodiment, the scheduler unit 1604 includes two dispatch 1618 units that enable two different instructions from the same warp to be dispatched during each clock cycle. In alternative embodiments, each scheduler unit 1604 may include a single dispatch 1618 unit or additional dispatch 1618 units.

Each streaming multiprocessor 1600 includes a register file 1606 that provides a set of registers for the functional units of the streaming multiprocessor 1600. In an embodiment, the register file 1606 is divided between each of the functional units such that each functional unit is allocated a dedicated portion of the register file 1606. In another embodiment, the register file 1606 is divided between the different warps being executed by the streaming multiprocessor 1600. The register file 1606 provides temporary storage for operands connected to the data paths of the functional units.

Each streaming multiprocessor 1600 comprises L processing core 1608 modules. In an embodiment, the streaming multiprocessor 1600 includes a large number (e.g., 128, etc.) of distinct processing core 1608 modules. Each core 1608 may include a fully-pipelined, single-precision, double-precision, and/or mixed precision processing unit that includes a floating point arithmetic logic unit and an integer arithmetic logic unit. In an embodiment, the floating point arithmetic logic units implement the IEEE 754-2008 standard for floating point arithmetic. In an embodiment, the core 1608 modules include 64 single-precision (32-bit) floating point cores, 64 integer cores, 32 double-precision (64-bit) floating point cores, and 8 tensor cores.

Tensor cores configured to perform matrix operations, and, in an embodiment, one or more tensor cores are included in the core 1608 modules. In particular, the tensor cores are configured to perform deep learning matrix arithmetic, such as convolution operations for neural network training and inferencing. In an embodiment, each tensor core operates on a 4×4 matrix and performs a matrix multiply and accumulate operation D=A'B+C, where A, B, C, and D are 4×4 matrices.

In an embodiment, the matrix multiply inputs A and B are 16-bit floating point matrices, while the accumulation matrices C and D may be 16-bit floating point or 32-bit floating point matrices. Tensor Cores operate on 16-bit floating point input data with 32-bit floating point accumulation. The 16-bit floating point multiply requires 64 operations and results in a full precision product that is then accumulated using 32-bit floating point addition with the other intermediate products for a 4×4×4 matrix multiply. In practice, Tensor Cores are used to perform much larger two-dimensional or higher dimensional matrix operations, built up from these smaller elements. An API, such as CUDA 9 C++API, exposes specialized matrix load, matrix multiply and accumulate, and matrix store operations to efficiently use Tensor Cores from a CUDA-C++ program. At the CUDA level, the warp-level interface assumes 16×16 size matrices spanning all 32 threads of the warp.

Each streaming multiprocessor 1600 also comprises M special function unit 1610 modules that perform special functions (e.g., attribute evaluation, reciprocal square root, and the like). In an embodiment, the special function unit 1610 modules may include a tree traversal unit configured to traverse a hierarchical tree data structure. In an embodiment, the special function unit 1610 modules may include texture unit configured to perform texture map filtering operations. In an embodiment, the texture units are configured to load texture maps (e.g., a 2D array of texels) from the memory 1320 and sample the texture maps to produce sampled texture values for use in shader programs executed by the streaming multiprocessor 1600. In an embodiment, the texture maps are stored in the shared memory/L1 cache 1616. The texture units implement texture operations such as filtering operations using mip-maps (e.g., texture maps of varying levels of detail). In an embodiment, each streaming multiprocessor 1600 includes two texture units.

Each streaming multiprocessor 1600 also comprises N load/store unit 1612 modules that implement load and store operations between the shared memory/L1 cache 1616 and the register file 1606. Each streaming multiprocessor 1600 includes an interconnect network 1614 that connects each of the functional units to the register file 1606 and the load/store unit 1612 to the register file 1606 and shared memory/L1 cache 1616. In an embodiment, the interconnect network 1614 is a crossbar that can be configured to connect any of the functional units to any of the registers in the register file 1606 and connect the load/store unit 1612 modules to the register file 1606 and memory locations in shared memory/L1 cache 1616.

The shared memory/L1 cache 1616 is an array of on-chip memory that allows for data storage and communication between the streaming multiprocessor 1600 and the primitive engine 1414 and between threads in the streaming multiprocessor 1600. In an embodiment, the shared memory/L1 cache 1616 comprises 128 KB of storage capacity and is in the path from the streaming multiprocessor 1600 to the memory partition unit 1500. The shared memory/L1 cache 1616 can be used to cache reads and writes. One or more of the shared memory/L1 cache 1616, level two cache 1504, and memory 1320 are backing stores.

Combining data cache and shared memory functionality into a single memory block provides the best overall performance for both types of memory accesses. The capacity is usable as a cache by programs that do not use shared memory. For example, if shared memory is configured to use half of the capacity, texture and load/store operations can use the remaining capacity. Integration within the shared memory/L1 cache 1616 enables the shared memory/L1 cache 1616 to function as a high-throughput conduit for streaming data while simultaneously providing high-bandwidth and low-latency access to frequently reused data.

When configured for general purpose parallel computation, a simpler configuration can be used compared with graphics processing. Specifically, the fixed function graphics processing units shown in FIG. 13, are bypassed, creating a much simpler programming model. In the general purpose parallel computation configuration, the work distribution unit 1310 assigns and distributes blocks of threads directly to the data processing cluster 1412 modules. The threads in a block execute the same program, using a unique thread ID in the calculation to ensure each thread generates unique results, using the streaming multiprocessor 1600 to execute the program and perform calculations, shared memory/L1 cache 1616 to communicate between threads, and the load/store unit 1612 to read and write global memory through the shared memory/L1 cache 1616 and the memory partition unit 1500. When configured for general purpose parallel computation, the streaming multiprocessor 1600 can also write commands that the scheduler unit 1308 can use to launch new work on the data processing cluster 1412 modules.

The parallel processing unit 1302 may be included in a desktop computer, a laptop computer, a tablet computer, servers, supercomputers, a smart-phone (e.g., a wireless, hand-held device), personal digital assistant (PDA), a digital camera, a vehicle, a head mounted display, a hand-held electronic device, and the like. In an embodiment, the parallel processing unit 1302 is embodied on a single semiconductor substrate. In another embodiment, the parallel processing unit 1302 is included in a system-on-a-chip (SoC) along with one or more other devices such as additional parallel processing unit 1302 modules, the memory 1320, a reduced instruction set computer (RISC) CPU, a memory management unit (MMU), a digital-to-analog converter (DAC), and the like.

In an embodiment, the parallel processing unit 1302 may be included on a graphics card that includes one or more memory devices. The graphics card may be configured to interface with a PCIe slot on a motherboard of a desktop computer. In yet another embodiment, the parallel processing unit 1302 may be an integrated graphics processing unit (iGPU) or parallel processor included in the chipset of the motherboard.

Exemplary Computing System

Systems with multiple GPUs and CPUs are used in a variety of industries as developers expose and leverage more parallelism in applications such as artificial intelligence computing. High-performance GPU-accelerated systems with tens to many thousands of compute nodes are deployed in data centers, research facilities, and supercomputers to solve ever larger problems. As the number of processing devices within the high-performance systems increases, the communication and data transfer mechanisms need to scale to support the increased bandwidth.

Figure 17:
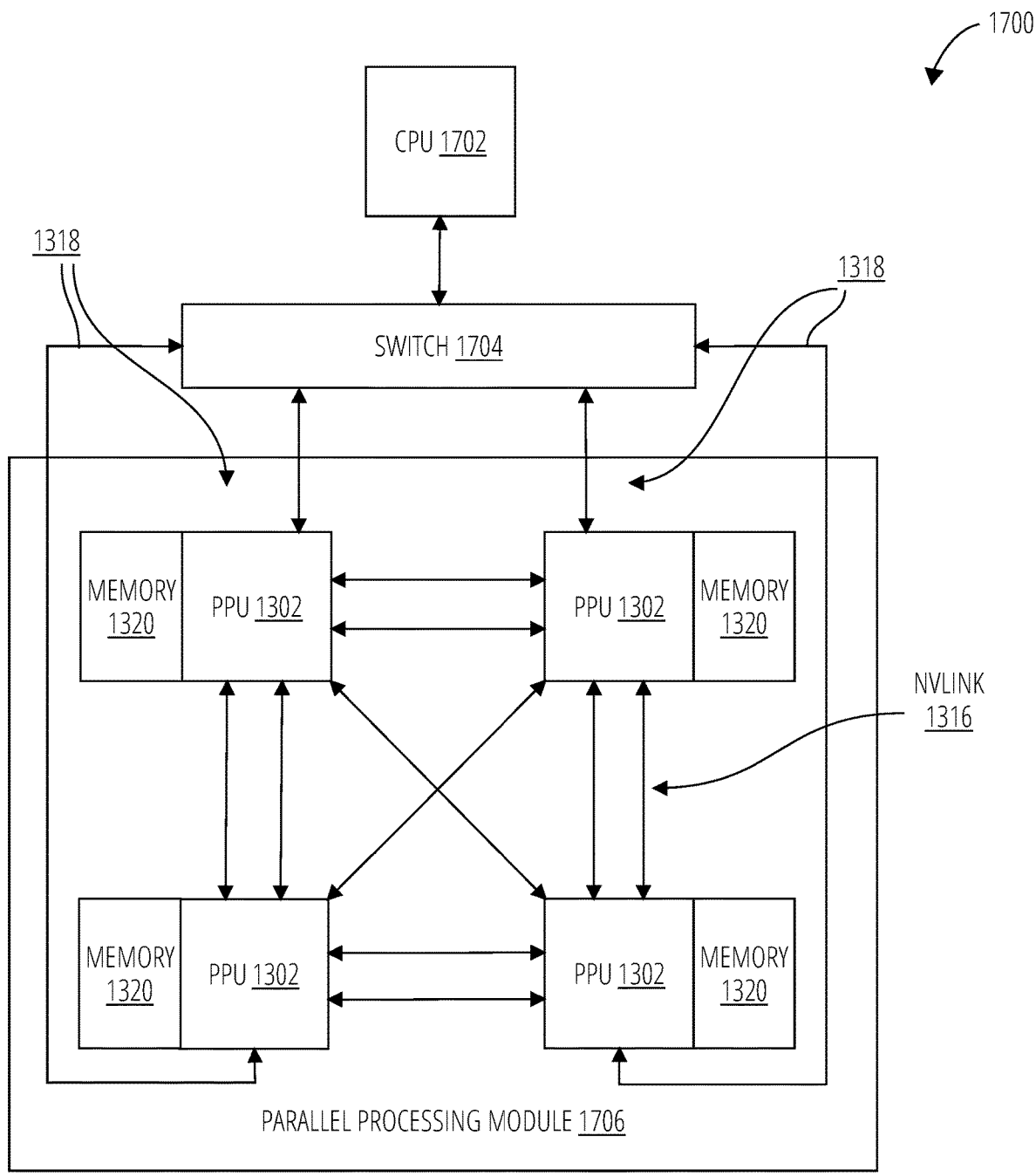
FIG. 17 depicts a processing system 1700 in accordance with one embodiment.

FIG. 17 is a conceptual diagram of a processing system 1700 implemented using the parallel processing unit 1302 of FIG. 13, in accordance with an embodiment. The processing system 1700 includes a central processing unit 1702, switch 1704, and multiple parallel processing unit 1302 modules each and respective memory 1320 modules. The NVLink 1316 provides high-speed communication links between each of the parallel processing unit 1302 modules. Although a particular number of NVLink 1316 and interconnect 1318 connections are illustrated in FIG. 17, the number of connections to each parallel processing unit 1302 and the central processing unit 1702 may vary. The switch 1704 interfaces between the interconnect 1318 and the central processing unit 1702. The parallel processing unit 1302 modules, memory 1320 modules, and NVLink 1316 connections may be situated on a single semiconductor platform to form a parallel processing module 1706. In an embodiment, the switch 1704 supports two or more protocols to interface between various different connections and/or links.

In another embodiment (not shown), the NVLink 1316 provides one or more high-speed communication links between each of the parallel processing unit modules (parallel processing unit 1302, parallel processing unit 1302, parallel processing unit 1302, and parallel processing unit 1302) and the central processing unit 1702 and the switch 1704 interfaces between the interconnect 1318 and each of the parallel processing unit modules. The parallel processing unit modules, memory 1320 modules, and interconnect 1318 may be situated on a single semiconductor platform to form a parallel processing module 1706. In yet another embodiment (not shown), the interconnect 1318 provides one or more communication links between each of the parallel processing unit modules and the central processing unit 1702 and the switch 1704 interfaces between each of the parallel processing unit modules using the NVLink 1316 to provide one or more high-speed communication links between the parallel processing unit modules. In another embodiment (not shown), the NVLink 1316 provides one or more high-speed communication links between the parallel processing unit modules and the central processing unit 1702 through the switch 1704. In yet another embodiment (not shown), the interconnect 1318 provides one or more communication links between each of the parallel processing unit modules directly. One or more of the NVLink 1316 high-speed communication links may be implemented as a physical NVLink interconnect or either an on-chip or on-die interconnect using the same protocol as the NVLink 1316.

In the context of the present description, a single semiconductor platform may refer to a sole unitary semiconductor-based integrated circuit fabricated on a die or chip. It should be noted that the term single semiconductor platform may also refer to multi-chip modules with increased connectivity which simulate on-chip operation and make substantial improvements over utilizing a conventional bus implementation. Of course, the various circuits or devices may also be situated separately or in various combinations of semiconductor platforms per the desires of the user. Alternately, the parallel processing module 1706 may be implemented as a circuit board substrate and each of the parallel processing unit modules and/or memory 1320 modules may be packaged devices. In an embodiment, the central processing unit 1702, switch 1704, and the parallel processing module 1706 are situated on a single semiconductor platform.

In an embodiment, the signaling rate of each NVLink 1316 is 20 to 25 Gigabits/second and each parallel processing unit module includes six NVLink 1316 interfaces (as shown in FIG. 17, five NVLink 1316 interfaces are included for each parallel processing unit module). Each NVLink 1316 provides a data transfer rate of 25 Gigabytes/second in each direction, with six links providing 300 Gigabytes/second. The NVLink 1316 can be used exclusively for PPU-to-PPU communication as shown in FIG. 17, or some combination of PPU-to-PPU and PPU-to-CPU, when the central processing unit 1702 also includes one or more NVLink 1316 interfaces.

In an embodiment, the NVLink 1316 allows direct load/store/atomic access from the central processing unit 1702 to each parallel processing unit module's memory 1320. In an embodiment, the NVLink 1316 supports coherency operations, allowing data read from the memory 1320 modules to be stored in the cache hierarchy of the central processing unit 1702, reducing cache access latency for the central processing unit 1702. In an embodiment, the NVLink 1316 includes support for Address Translation Services (ATS), enabling the parallel processing unit module to directly access page tables within the central processing unit 1702. One or more of the NVLink 1316 may also be configured to operate in a low-power mode.

Figure 18:
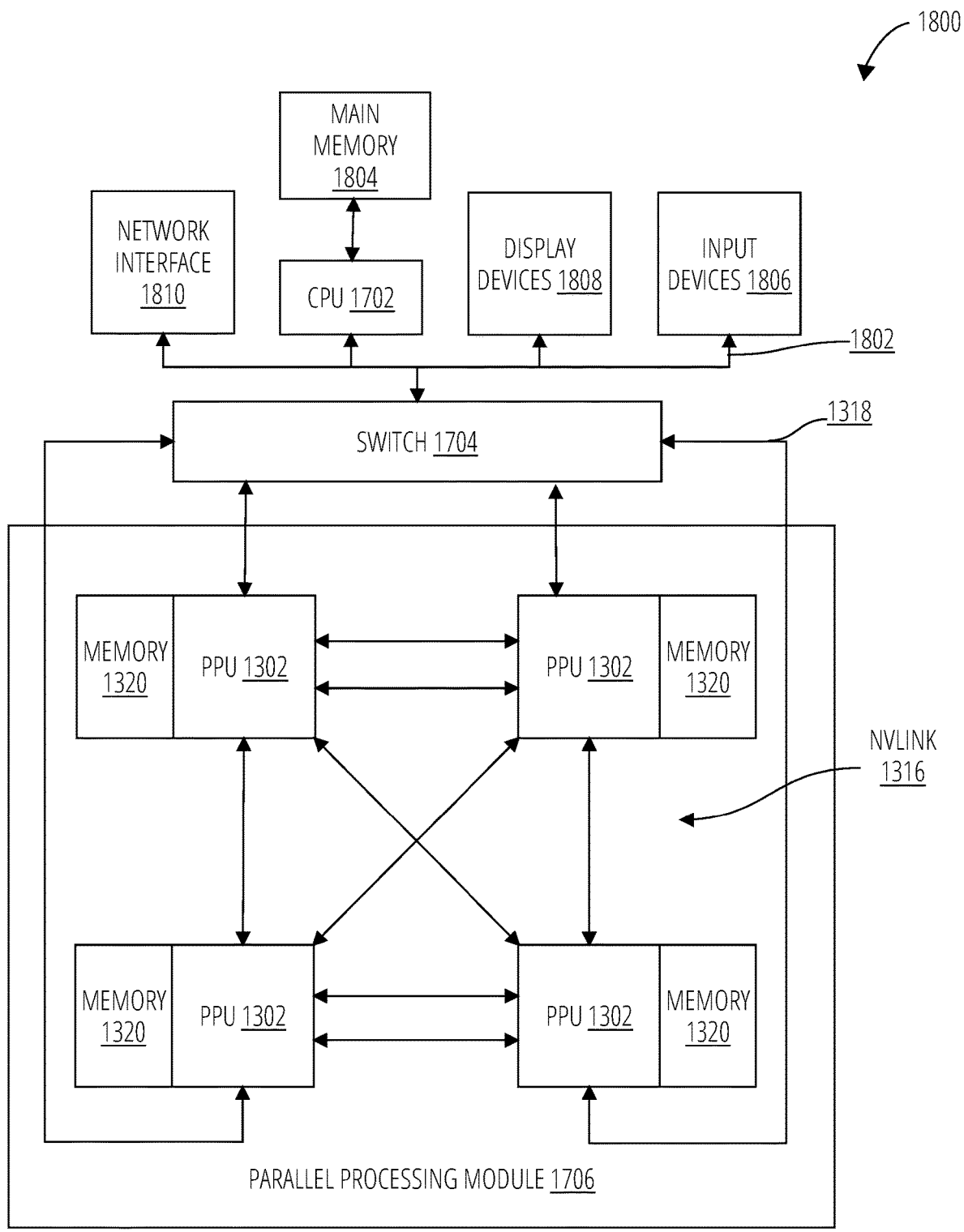
FIG. 18 depicts an exemplary processing system 1800 in accordance with another embodiment.

FIG. 18 depicts an exemplary processing system 1800 in which the various architecture and/or functionality of the various previous embodiments may be implemented. As shown, an exemplary processing system 1800 is provided including at least one central processing unit 1702 that is connected to a communications bus 1802. The communication communications bus 1802 may be implemented using any suitable protocol, such as PCI (Peripheral Component Interconnect), PCI-Express, AGP (Accelerated Graphics Port), HyperTransport, or any other bus or point-to-point communication protocol(s). The exemplary processing system 1800 also includes a main memory 1804. Control logic (software) and data are stored in the main memory 1804 which may take the form of random access memory (RAM).

The exemplary processing system 1800 also includes input devices 1806, the parallel processing module 1706, and display devices 1808, e.g. a conventional CRT (cathode ray tube), LCD (liquid crystal display), LED (light emitting diode), plasma display or the like. User input may be received from the input devices 1806, e.g., keyboard, mouse, touchpad, microphone, and the like. Each of the foregoing modules and/or devices may even be situated on a single semiconductor platform to form the exemplary processing system 1800. Alternately, the various modules may also be situated separately or in various combinations of semiconductor platforms per the desires of the user.

Further, the exemplary processing system 1800 may be coupled to a network (e.g., a telecommunications network, local area network (LAN), wireless network, wide area network (WAN) such as the Internet, peer-to-peer network, cable network, or the like) through a network interface 1810 for communication purposes.

The exemplary processing system 1800 may also include a secondary storage (not shown). The secondary storage includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner.

Computer programs, or computer control logic algorithms, may be stored in the main memory 1804 and/or the secondary storage. Such computer programs, when executed, enable the exemplary processing system 1800 to perform various functions. The main memory 1804, the storage, and/or any other storage are possible examples of computer-readable media.

The architecture and/or functionality of the various previous figures may be implemented in the context of a general computer system, a circuit board system, a game console system dedicated for entertainment purposes, an application-specific system, and/or any other desired system. For example, the exemplary processing system 1800 may take the form of a desktop computer, a laptop computer, a tablet computer, servers, supercomputers, a smart-phone (e.g., a wireless, hand-held device), personal digital assistant (PDA), a digital camera, a vehicle, a head mounted display, a hand-held electronic device, a mobile phone device, a television, workstation, game consoles, embedded system, and/or any other type of logic.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

Graphics Processing Pipeline

Figure 19:
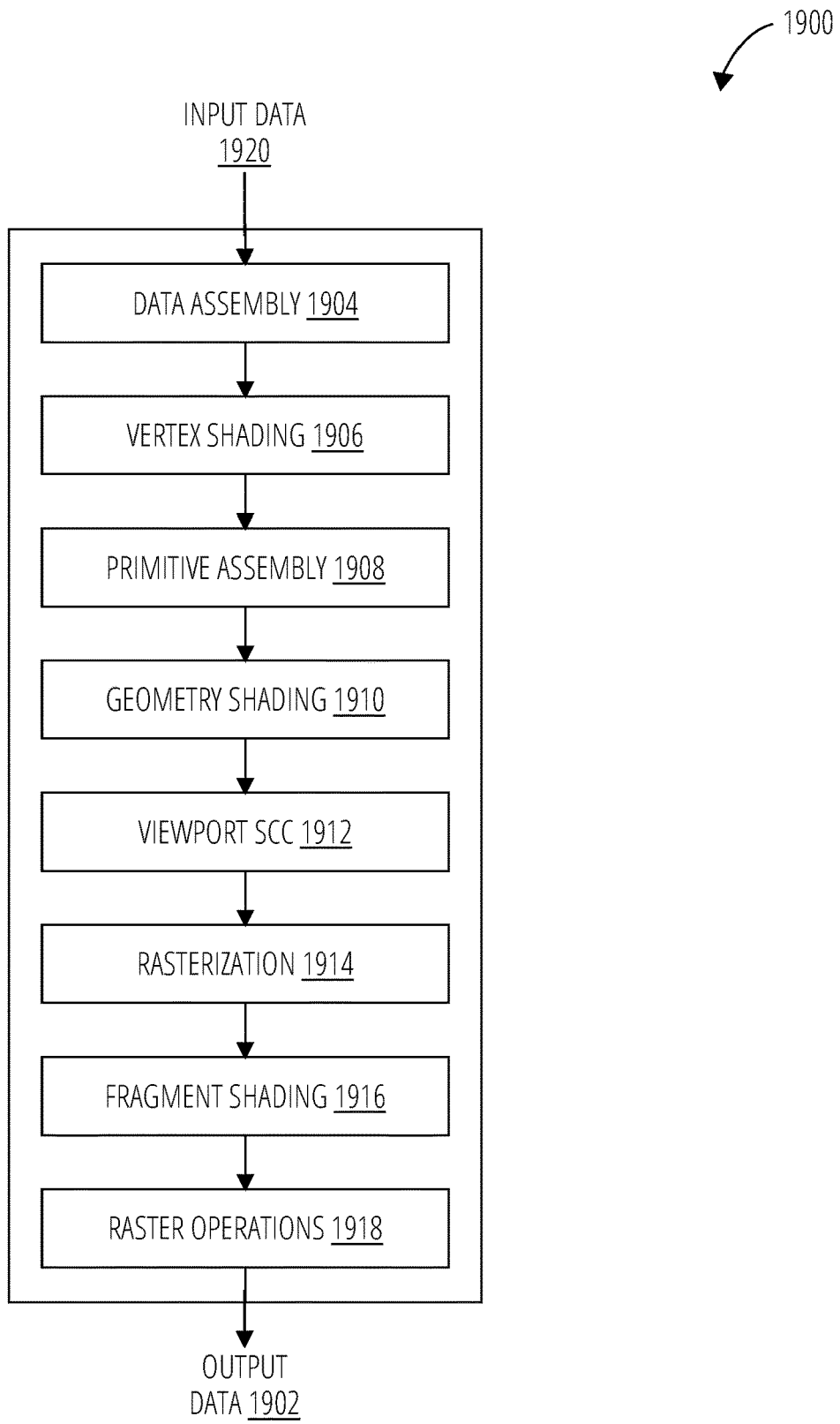
FIG. 19 depicts a graphics processing pipeline 1900 in accordance with one embodiment.

FIG. 19 is a conceptual diagram of a graphics processing pipeline 1900 implemented by the parallel processing unit 1302 of FIG. 13, in accordance with an embodiment. In an embodiment, the parallel processing unit 1302 comprises a graphics processing unit (GPU). The parallel processing unit 1302 is configured to receive commands that specify shader programs for processing graphics data. Graphics data may be defined as a set of primitives such as points, lines, triangles, quads, triangle strips, and the like. Typically, a primitive includes data that specifies a number of vertices for the primitive (e.g., in a model-space coordinate system) as well as attributes associated with each vertex of the primitive. The parallel processing unit 1302 can be configured to process the graphics primitives to generate a frame buffer (e.g., pixel data for each of the pixels of the display).

An application writes model data for a scene (e.g., a collection of vertices and attributes) to a memory such as a system memory or memory 1320. The model data defines each of the objects that may be visible on a display. The application then makes an API call to the driver kernel that requests the model data to be rendered and displayed. The driver kernel reads the model data and writes commands to the one or more streams to perform operations to process the model data. The commands may reference different shader programs to be implemented on the streaming multiprocessor 1600 modules of the parallel processing unit 1302 including one or more of a vertex shader, hull shader, domain shader, geometry shader, and a pixel shader. For example, one or more of the streaming multiprocessor 1600 modules may be configured to execute a vertex shader program that processes a number of vertices defined by the model data. In an embodiment, the different streaming multiprocessor 1600 modules may be configured to execute different shader programs concurrently. For example, a first subset of streaming multiprocessor 1600 modules may be configured to execute a vertex shader program while a second subset of streaming multiprocessor 1600 modules may be configured to execute a pixel shader program. The first subset of streaming multiprocessor 1600 modules processes vertex data to produce processed vertex data and writes the processed vertex data to the level two cache 1504 and/or the memory 1320. After the processed vertex data is rasterized (e.g., transformed from three-dimensional data into two-dimensional data in screen space) to produce fragment data, the second subset of streaming multiprocessor 1600 modules executes a pixel shader to produce processed fragment data, which is then blended with other processed fragment data and written to the frame buffer in memory 1320. The vertex shader program and pixel shader program may execute concurrently, processing different data from the same scene in a pipelined fashion until all of the model data for the scene has been rendered to the frame buffer. Then, the contents of the frame buffer are transmitted to a display controller for display on a display device.

The graphics processing pipeline 1900 is an abstract flow diagram of the processing steps implemented to generate 2D computer-generated images from 3D geometry data. As is well-known, pipeline architectures may perform long latency operations more efficiently by splitting up the operation into a plurality of stages, where the output of each stage is coupled to the input of the next successive stage. Thus, the graphics processing pipeline 1900 receives input data 601 that is transmitted from one stage to the next stage of the graphics processing pipeline 1900 to generate output data 1902. In an embodiment, the graphics processing pipeline 1900 may represent a graphics processing pipeline defined by the OpenGL® API. As an option, the graphics processing pipeline 1900 may be implemented in the context of the functionality and architecture of the previous Figures and/or any subsequent Figure(s).

As shown in FIG. 19, the graphics processing pipeline 1900 comprises a pipeline architecture that includes a number of stages. The stages include, but are not limited to, a data assembly 1904 stage, a vertex shading 1906 stage, a primitive assembly 1908 stage, a geometry shading 1910 stage, a viewport SCC 1912 stage, a rasterization 1914 stage, a fragment shading 1916 stage, and a raster operations 1918 stage. In an embodiment, the input data 1920 comprises commands that configure the processing units to implement the stages of the graphics processing pipeline 1900 and geometric primitives (e.g., points, lines, triangles, quads, triangle strips or fans, etc.) to be processed by the stages. The output data 1902 may comprise pixel data (e.g., color data) that is copied into a frame buffer or other type of surface data structure in a memory.

The data assembly 1904 stage receives the input data 1920 that specifies vertex data for high-order surfaces, primitives, or the like. The data assembly 1904 stage collects the vertex data in a temporary storage or queue, such as by receiving a command from the host processor that includes a pointer to a buffer in memory and reading the vertex data from the buffer. The vertex data is then transmitted to the vertex shading 1906 stage for processing.

The vertex shading 1906 stage processes vertex data by performing a set of operations (e.g., a vertex shader or a program) once for each of the vertices. Vertices may be, e.g., specified as a 4-coordinate vector (e.g., <x, y, z, w>) associated with one or more vertex attributes (e.g., color, texture coordinates, surface normal, etc.). The vertex shading 1906 stage may manipulate individual vertex attributes such as position, color, texture coordinates, and the like. In other words, the vertex shading 1906 stage performs operations on the vertex coordinates or other vertex attributes associated with a vertex. Such operations commonly including lighting operations (e.g., modifying color attributes for a vertex) and transformation operations (e.g., modifying the coordinate space for a vertex). For example, vertices may be specified using coordinates in an object-coordinate space, which are transformed by multiplying the coordinates by a matrix that translates the coordinates from the object-coordinate space into a world space or a normalized-device-coordinate (NCD) space. The vertex shading 1906 stage generates transformed vertex data that is transmitted to the primitive assembly 1908 stage.

The primitive assembly 1908 stage collects vertices output by the vertex shading 1906 stage and groups the vertices into geometric primitives for processing by the geometry shading 1910 stage. For example, the primitive assembly 1908 stage may be configured to group every three consecutive vertices as a geometric primitive (e.g., a triangle) for transmission to the geometry shading 1910 stage. In some embodiments, specific vertices may be reused for consecutive geometric primitives (e.g., two consecutive triangles in a triangle strip may share two vertices). The primitive assembly 1908 stage transmits geometric primitives (e.g., a collection of associated vertices) to the geometry shading 1910 stage.

The geometry shading 1910 stage processes geometric primitives by performing a set of operations (e.g., a geometry shader or program) on the geometric primitives. Tessellation operations may generate one or more geometric primitives from each geometric primitive. In other words, the geometry shading 1910 stage may subdivide each geometric primitive into a finer mesh of two or more geometric primitives for processing by the rest of the graphics processing pipeline 1900. The geometry shading 1910 stage transmits geometric primitives to the viewport SCC 1912 stage.

In an embodiment, the graphics processing pipeline 1900 may operate within a streaming multiprocessor and the vertex shading 1906 stage, the primitive assembly 1908 stage, the geometry shading 1910 stage, the fragment shading 1916 stage, and/or hardware/software associated therewith, may sequentially perform processing operations. Once the sequential processing operations are complete, in an embodiment, the viewport SCC 1912 stage may utilize the data. In an embodiment, primitive data processed by one or more of the stages in the graphics processing pipeline 1900 may be written to a cache (e.g. L1 cache, a vertex cache, etc.). In this case, in an embodiment, the viewport SCC 1912 stage may access the data in the cache. In an embodiment, the viewport SCC 1912 stage and the rasterization 1914 stage are implemented as fixed function circuitry.

The viewport SCC 1912 stage performs viewport scaling, culling, and clipping of the geometric primitives. Each surface being rendered to is associated with an abstract camera position. The camera position represents a location of a viewer looking at the scene and defines a viewing frustum that encloses the objects of the scene. The viewing frustum may include a viewing plane, a rear plane, and four clipping planes. Any geometric primitive entirely outside of the viewing frustum may be culled (e.g., discarded) because the geometric primitive will not contribute to the final rendered scene. Any geometric primitive that is partially inside the viewing frustum and partially outside the viewing frustum may be clipped (e.g., transformed into a new geometric primitive that is enclosed within the viewing frustum. Furthermore, geometric primitives may each be scaled based on a depth of the viewing frustum. All potentially visible geometric primitives are then transmitted to the rasterization 1914 stage.

The rasterization 1914 stage converts the 3D geometric primitives into 2D fragments (e.g. capable of being utilized for display, etc.). The rasterization 1914 stage may be configured to utilize the vertices of the geometric primitives to setup a set of plane equations from which various attributes can be interpolated. The rasterization 1914 stage may also compute a coverage mask for a plurality of pixels that indicates whether one or more sample locations for the pixel intercept the geometric primitive. In an embodiment, z-testing may also be performed to determine if the geometric primitive is occluded by other geometric primitives that have already been rasterized. The rasterization 1914 stage generates fragment data (e.g., interpolated vertex attributes associated with a particular sample location for each covered pixel) that are transmitted to the fragment shading 1916 stage.

The fragment shading 1916 stage processes fragment data by performing a set of operations (e.g., a fragment shader or a program) on each of the fragments. The fragment shading 1916 stage may generate pixel data (e.g., color values) for the fragment such as by performing lighting operations or sampling texture maps using interpolated texture coordinates for the fragment. The fragment shading 1916 stage generates pixel data that is transmitted to the raster operations 1918 stage.

The raster operations 1918 stage may perform various operations on the pixel data such as performing alpha tests, stencil tests, and blending the pixel data with other pixel data corresponding to other fragments associated with the pixel. When the raster operations 1918 stage has finished processing the pixel data (e.g., the output data 1902), the pixel data may be written to a render target such as a frame buffer, a color buffer, or the like.

It will be appreciated that one or more additional stages may be included in the graphics processing pipeline 1900 in addition to or in lieu of one or more of the stages described above. Various implementations of the abstract graphics processing pipeline may implement different stages. Furthermore, one or more of the stages described above may be excluded from the graphics processing pipeline in some embodiments (such as the geometry shading 1910 stage). Other types of graphics processing pipelines are contemplated as being within the scope of the present disclosure. Furthermore, any of the stages of the graphics processing pipeline 1900 may be implemented by one or more dedicated hardware units within a graphics processor such as parallel processing unit 1302. Other stages of the graphics processing pipeline 1900 may be implemented by programmable hardware units such as the streaming multiprocessor 1600 of the parallel processing unit 1302.

The graphics processing pipeline 1900 may be implemented via an application executed by a host processor, such as a CPU. In an embodiment, a device driver may implement an application programming interface (API) that defines various functions that can be utilized by an application in order to generate graphical data for display. The device driver is a software program that includes a plurality of instructions that control the operation of the parallel processing unit 1302. The API provides an abstraction for a programmer that lets a programmer utilize specialized graphics hardware, such as the parallel processing unit 1302, to generate the graphical data without requiring the programmer to utilize the specific instruction set for the parallel processing unit 1302. The application may include an API call that is routed to the device driver for the parallel processing unit 1302. The device driver interprets the API call and performs various operations to respond to the API call. In some instances, the device driver may perform operations by executing instructions on the CPU. In other instances, the device driver may perform operations, at least in part, by launching operations on the parallel processing unit 1302 utilizing an input/output interface between the CPU and the parallel processing unit 1302. In an embodiment, the device driver is configured to implement the graphics processing pipeline 1900 utilizing the hardware of the parallel processing unit 1302.

Various programs may be executed within the parallel processing unit 1302 in order to implement the various stages of the graphics processing pipeline 1900. For example, the device driver may launch a kernel on the parallel processing unit 1302 to perform the vertex shading 1906 stage on one streaming multiprocessor 1600 (or multiple streaming multiprocessor 1600 modules). The device driver (or the initial kernel executed by the parallel processing unit 1302) may also launch other kernels on the parallel processing unit 1302 to perform other stages of the graphics processing pipeline 1900, such as the geometry shading 1910 stage and the fragment shading 1916 stage. In addition, some of the stages of the graphics processing pipeline 1900 may be implemented on fixed unit hardware such as a rasterizer or a data assembler implemented within the parallel processing unit 1302. It will be appreciated that results from one kernel may be processed by one or more intervening fixed function hardware units before being processed by a subsequent kernel on a streaming multiprocessor 1600.

Figure 20:
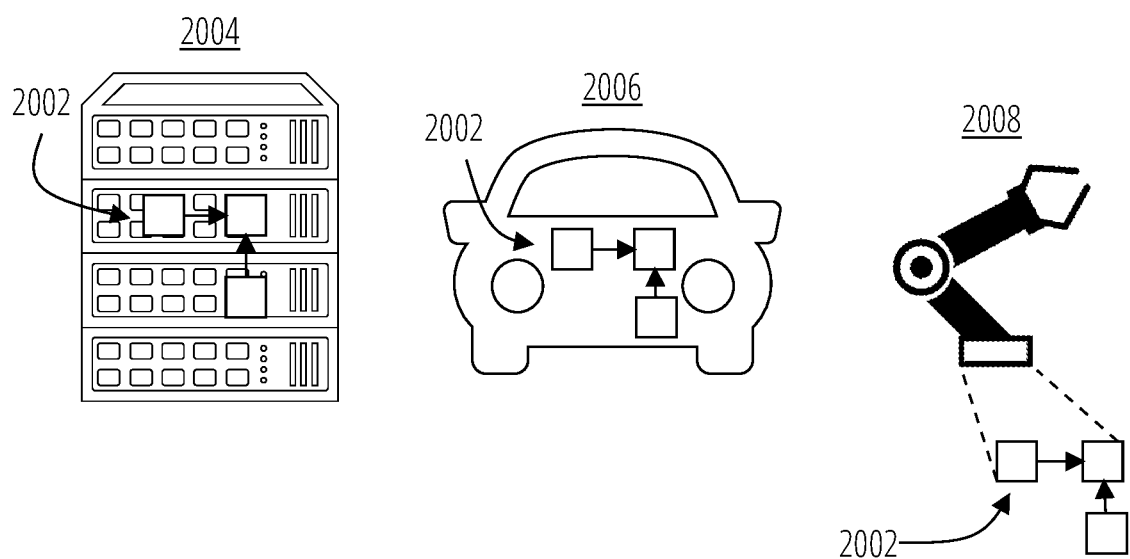
FIG. 20 depicts a circuit system 2002 in accordance with one embodiment.

FIG. 20 depicts exemplary scenarios for use of a circuit system 2002 in accordance with the mechanisms disclosed herein. Such a circuit system 2002 may be utilized in a computing system 2004, a vehicle 2006, and a robot 2008, to name just a few examples. The circuit system 2002 may utilize multiple supply voltage domains and may implement mechanisms in accordance with the ones described herein to mitigate signal timing race conditions across variations in one or both supply voltage levels or ranges, or a gap between them.

LISTING OF DRAWING ELEMENTS

100 memory cells
102 bitline
104 word line
106 full-selected cell
108 half-selected cell
202 memory controller
204 row address decoder
206 column decoder
208 memory controller
210 machine memory
212 clock
402 latch
502 global bitline
504 output transistor
1002 READ bitline precharge driver
1004 keeper circuit
1102 delay element
1104 delay element internal stage
1106 delay element
1108 delay element internal stage
1110 NMOS pull-down transistor
1202 delay elements
1204 delay element
1302 parallel processing unit
1304 I/O unit
1306 front-end unit
1308 scheduler unit
1310 work distribution unit
1312 hub
1314 crossbar
1316 NVLink
1318 interconnect
1320 memory
1400 general processing cluster
1402 pipeline manager
1404 pre-raster operations unit
1406 raster engine
1408 work distribution crossbar
1410 memory management unit
1412 data processing cluster
1414 primitive engine
1416 M-pipe controller
1500 memory partition unit
1502 raster operations unit
1504 level two cache
1506 memory interface
1600 streaming multiprocessor
1602 instruction cache 1604 scheduler unit
1606 register file
1608 core
1610 special function unit
1612 load/store unit
1614 interconnect network
1616 shared memory/L1 cache
1618 dispatch
1700 processing system
1702 central processing unit
1704 switch
1706 parallel processing module
1800 exemplary processing system
1802 communications bus
1804 main memory
1806 input devices
1808 display devices
1810 network interface
1900 graphics processing pipeline
1902 output data
1904 data assembly
1906 vertex shading
1908 primitive assembly
1910 geometry shading
1912 viewport SCC
1914 rasterization
1916 fragment shading
1918 raster operations
1920 input data
2002 circuit system
2004 computing system
2006 vehicle
2008 robot Various functional operations described herein may be implemented in logic that is referred to using a noun or noun phrase reflecting said operation or function. For example, an association operation may be carried out by an "associator" or "correlator". Likewise, switching may be carried out by a "switch", selection by a "selector", and so on. "Logic" refers to machine memory circuits and non-transitory machine readable media comprising machine-executable instructions (software and firmware), and/or circuitry (hardware) which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter). Logic symbols in the drawings should be accorded their ordinary understanding and interpretation in the art, unless otherwise indicated.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

As used herein, a recitation of "and/or" with respect to two or more elements should be interpreted to mean only one element, or a combination of elements. For example, "element A, element B, and/or element C" may include only element A, only element B, only element C, element A and element B, element A and element C, element B and element C, or elements A, B, and C. In addition, "at least one of element A or element B" may include at least one of element A, at least one of element B, or at least one of element A and at least one of element B. Further, "at least one of element A and element B" may include at least one of element A, at least one of element B, or at least one of element A and at least one of element B.

The subject matter of the present disclosure is described with specificity herein to meet statutory requirements. However, the description itself is not intended to limit the scope of this disclosure. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

Having thus described illustrative embodiments in detail, it will be apparent that modifications and variations are possible without departing from the scope of the invention as claimed. The scope of inventive subject matter is not limited to the depicted embodiments but is rather set forth in the following Claims.

What is claimed is:

1. A circuit comprising:
   a plurality of memory banks;
   a global bitline distributed to memory cells in each of the memory banks, the memory cells configured to utilize supply voltages from both of a write domain supply and a read domain supply;
   the memory cells configured to output a stored value to the global bitline in response to a global read evaluation signal;
   logic to maintain the global read evaluation signal in a timing window by adaptive adjustment of a delay for activating a keeper signal for the global read evaluation signal, the adaptive adjustment based on variations to at least one of the supply voltages;
   a clock line configured to activate the keeper signal; and
   the clock line comprising at least one delay element configured to have a propagation delay that tracks the variations.

2. The circuit of claim 1, wherein the global read evaluation signal is configured to operate in the read domain.

3. The circuit of claim 1, wherein the keeper signal is configured to operate in the read domain.

4. The circuit of claim 1, wherein the adaptive adjustment is based on variations in a gap between the supply voltages.

5. The circuit of claim 1, at least one of the delay elements that comprising a PN transistor stack receiving channel voltage from the read domain and a pull-down transistor with a gate biased from the write domain.

6. The circuit of claim 1, wherein the memory cells are six-transistor memory cells.

7. A circuit comprising:
   a memory circuit operating in a plurality of voltage domains;
   a keeper circuit for a global read evaluation signal for the memory circuit;
   logic to cause an activation timing of the keeper circuit to track variations between the voltage domains;
   a clock line configured to activate an output of the keeper circuit; and
   the clock line comprising at least one delay element configured to have a propagation delay that tracks the variations.

8. A static random access memory (SRAM) system comprising:
   a plurality of memory banks each comprising memory cells;
   a hierarchical bitline structure comprising local bitlines for the memory banks and a global bitline spanning the memory banks;
   a keeper circuit for one or both of the global bitline and one or more of the local bitlines, the keeper circuit configured to track read performance variations of the memory cells caused by variations between a first supply voltage for bit-storing cells of the memory cells and a second supply voltage for read ports of the bit-storing cells;
   a clock line configured to generate a clock pulse for READ evaluation; and
   the clock line comprising at least one delay element configured to have a propagation delay that tracks variations between the first supply voltage and the second supply voltage.

9. The SRAM system of claim 8, wherein the keeper circuit is configured such that a propagation delay of an output of the keeper circuit tracks the first supply voltage.

10. The SRAM system of claim 9, wherein the output of the keeper circuit is in a domain of the second supply voltage.

11. The SRAM system of claim 9, wherein the propagation delay of the output of the keeper circuit is configured to depend on delay elements in a clock line to the keeper circuit, and one or more of the delay elements are configured to operate responsive to both of the first supply voltage and the second supply voltage.

12. A machine memory system comprising:
    a plurality of bit-storing cells;
    a memory controller;
    a global bitline coupling the memory controller to the plurality of bit-storing cells;
    logic to maintain a global read evaluation signal on the global bitline in a timing window by adaptive adjustment of a delay for activating a keeper signal for the global read evaluation signal, the adaptive adjustment based on variations in one or more of a variation in a first supply voltage for the bit-storing cells and a second supply voltage for read ports of the bit-storing cells;
    a clock line configured to activate the keeper signal; and
    the clock line comprising at least one delay element configured to have a propagation delay that tracks variations between the first supply voltage and the second supply voltage.

13. The machine memory system of claim 12, wherein the delay element comprises a PN transistor stack receiving the first supply voltage and a pull-down transistor receiving the second supply voltage.

14. The machine memory system of claim 12, further comprising:
    the clock line configured to generate a clock pulse for READ evaluation.

15. A circuit comprising:
    a memory circuit operating in a plurality of voltage domains;
    a keeper circuit for a global read evaluation signal for the memory circuit;
    logic to cause an activation timing of the keeper circuit to track variations between the voltage domains;
    a clock line configured to activate an output of the keeper circuit; and the clock line comprising at least one delay element configured to have a propagation delay that tracks the variations.

16. The circuit of claim 15, wherein the global read evaluation signal and the keeper circuit are configured to operate in the read domain.

17. The circuit of claim 15, at least one of the delay elements a PN transistor stack receiving channel voltage from a read voltage domain for the memory circuit and a pull-down transistor with a gate biased from a write voltage domain for the memory circuit.

18. The circuit of claim 15, wherein the memory circuit comprises six-transistor memory cells.

19. A machine memory system comprising:
a plurality of bit-storing cells;
a memory controller;
a global bitline coupling the memory controller to the plurality of bit-storing cells;
logic to maintain a global read evaluation signal on the global bitline in a timing window by adaptive adjustment of a delay for activating a keeper signal for the global read evaluation signal, the adaptive adjustment based on variations in one or more of a variation in a first supply voltage for the bit-storing cells and a second supply voltage for read ports of the bit-storing cells;
a clock line configured to generate a clock pulse for READ evaluation; and
the clock line comprising at least one delay element configured to have a propagation delay that tracks variations between the first supply voltage and the second supply voltage.

20. The machine memory system of claim 19, wherein the clock line is configured to activate an output of a keeper circuit for the global read evaluation signal.

* * * * *